(12) United States Patent
Furumoto et al.

(10) Patent No.: US 9,754,888 B2
(45) Date of Patent: Sep. 5, 2017

(54) SEMICONDUCTOR MEMORY DEVICE AND METHOD FOR MANUFACTURING THE SAME

(71) Applicant: KABUSHIKI KAISHA TOSHIBA, Tokyo (JP)

(72) Inventors: Kazuhito Furumoto, Mie (JP); Toshiyuki Sasaki, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/133,523

(22) Filed: Apr. 20, 2016

(65) Prior Publication Data
US 2017/0170125 A1 Jun. 15, 2017

Related U.S. Application Data

(60) Provisional application No. 62/266,961, filed on Dec. 14, 2015.

(51) Int. Cl.
| | | |
|---|---|---|
| H01L 23/52 | (2006.01) |
| H01L 23/532 | (2006.01) |
| H01L 27/1157 | (2017.01) |
| H01L 27/11582 | (2017.01) |
| H01L 23/528 | (2006.01) |

(Continued)

(52) U.S. Cl.
CPC .. H01L 23/53266 (2013.01); H01L 21/76816 (2013.01); H01L 21/76843 (2013.01); H01L 21/76897 (2013.01); H01L 23/5226 (2013.01); H01L 23/5283 (2013.01); H01L 27/1157 (2013.01); H01L 27/11582 (2013.01)

(58) Field of Classification Search
CPC ........... H01L 23/5226; H01L 23/53266; H01L 23/5283; H01L 21/76816; H01L 21/76843; H01L 21/76897; H01L 27/1157; H01L 27/11582
See application file for complete search history.

(56) References Cited

U.S. PATENT DOCUMENTS

| | | | |
|---|---|---|---|
| 7,884,417 B2 | 2/2011 | Mizukami et al. |
| 8,120,089 B2 * | 2/2012 | Kim .................. H01L 27/11578 |
| | | | 257/314 |
| 8,273,628 B2 | 9/2012 | Yahashi |

(Continued)

*Primary Examiner* — Nicholas Tobergte
(74) *Attorney, Agent, or Firm* — Finnegan, Henderson, Farabow, Garrett & Dunner, L.L.P.

(57) ABSTRACT

A semiconductor memory device according to one embodiment includes a plurality of lower electrode films stacked separated from each other, an upper electrode film provided above the plurality of lower electrode films, a semiconductor pillar extending in an arrangement direction of the plurality of lower electrode films and the upper electrode film, a memory film provided between the semiconductor pillar and one of the plurality of lower electrode films and between the semiconductor pillar and the upper electrode film, and a metal-containing layer provided at least one of on a lower surface and an upper surface of the one of the plurality of lower electrode films and between the one of the plurality of lower electrode films and the memory film, the metal-containing layer having a composition different from a composition of the plurality of lower electrode films. The upper electrode film is in contact with the memory film.

13 Claims, 23 Drawing Sheets

(51) Int. Cl.
*H01L 23/522* (2006.01)
*H01L 21/768* (2006.01)

(56) References Cited

U.S. PATENT DOCUMENTS

| | | | |
|---|---|---|---|
| 8,344,385 B2 | 1/2013 | Kim et al. | |
| 8,987,805 B2 * | 3/2015 | Nam | H01L 29/7926 257/324 |
| 9,177,966 B1 * | 11/2015 | Rabkin | H01L 27/11582 |
| 9,240,416 B2 * | 1/2016 | Shimura | H01L 27/11556 |
| 9,245,902 B2 * | 1/2016 | Jeong | H01L 27/0688 |
| 9,406,692 B2 * | 8/2016 | Lee | H01L 27/11582 |
| 9,461,061 B2 * | 10/2016 | Nam | H01L 27/11582 |
| 9,466,610 B1 * | 10/2016 | Yang | H01L 27/11582 |
| 9,484,389 B2 * | 11/2016 | Wouters | H01L 27/2481 |
| 9,536,897 B2 * | 1/2017 | Yoo | H01L 27/11582 |
| 2007/0158736 A1 * | 7/2007 | Arai | H01L 27/105 257/315 |
| 2007/0187359 A1 | 8/2007 | Nakagawa et al. | |
| 2008/0173928 A1 * | 7/2008 | Arai | H01L 29/7926 257/316 |
| 2009/0230459 A1 * | 9/2009 | Kito | H01L 27/11565 257/324 |
| 2011/0031547 A1 * | 2/2011 | Watanabe | H01L 27/11582 257/319 |
| 2011/0298013 A1 * | 12/2011 | Hwang | H01L 27/11551 257/208 |
| 2011/0298037 A1 * | 12/2011 | Choe | G11C 16/0483 257/324 |
| 2011/0298038 A1 * | 12/2011 | Son | H01L 27/11578 257/324 |
| 2011/0303970 A1 * | 12/2011 | Kim | H01L 27/11578 257/324 |
| 2011/0306195 A1 * | 12/2011 | Kim | H01L 27/11578 438/591 |
| 2012/0028450 A1 * | 2/2012 | Son | H01L 27/11578 438/479 |
| 2012/0032250 A1 * | 2/2012 | Son | H01L 21/28273 257/324 |
| 2012/0049268 A1 * | 3/2012 | Chang | H01L 21/28273 257/324 |
| 2012/0068255 A1 * | 3/2012 | Lee | H01L 27/11582 257/324 |
| 2012/0086072 A1 * | 4/2012 | Yun | H01L 27/11578 257/329 |
| 2012/0094453 A1 * | 4/2012 | Han | H01L 27/11582 438/269 |
| 2013/0032874 A1 * | 2/2013 | Ko | H01L 29/7926 257/324 |
| 2015/0060992 A1 | 3/2015 | Taekyung et al. | |

* cited by examiner

SEMICONDUCTOR MEMORY DEVICE AND METHOD FOR MANUFACTURING THE SAME

CROSS-REFERENCE TO RELATED APPLICATION

This application is based upon and claims the benefit of priority from U.S. Provisional Patent Application 62/266,961, filed on Dec. 14, 2015; the entire contents of which are incorporated herein by reference.

FIELD

Embodiments relate to a semiconductor memory device and a method for manufacturing the same.

BACKGROUND

In recent years, a stacked-type semiconductor memory device in which memory cells are three-dimensionally integrated has been proposed. In such a stacked-type semiconductor memory device, a stacked body in which electrode films and insulating films are alternately stacked on a semiconductor substrate is provided, and a semiconductor pillar piercing the stacked body is provided. At each of crossing portions between the electrode films and the semiconductor pillar, a select gate transistor and a memory cell transistor are formed. In such a semiconductor memory device, stability in characteristics is an issue.

DETAILED DESCRIPTION

A semiconductor memory device according to one embodiment includes a plurality of lower electrode films stacked separated from each other, an upper electrode film provided above the plurality of lower electrode films, a semiconductor pillar extending in an arrangement direction of the plurality of lower electrode films and the upper electrode film, a memory film provided between the semiconductor pillar and one of the plurality of lower electrode films and between the semiconductor pillar and the upper electrode film, and a metal-containing layer provided at least one of on a lower surface and an upper surface of the one of the plurality of lower electrode films and between the one of the plurality of lower electrode films and the memory film, the metal-containing layer having a composition different from a composition of the plurality of lower electrode films. The upper electrode film is in contact with the memory film.

A method for manufacturing a semiconductor memory device according to one embodiment includes forming a stacked body above a substrate by depositing lower insulating films and first films different in composition from the lower insulating films alternately and then depositing an upper electrode film made of metal. The method includes forming a mask film above the stacked body. The mask film has an opening. The method includes forming a hole in the upper electrode film by applying etching using the mask film as a mask and using an etching gas containing bromine. The method includes allowing the hole to pierce the first films and the lower insulating films by applying etching using the mask film as a mask. The method includes forming an insulating film on an inner surface of the hole. The method includes forming a semiconductor pillar on a side surface of the insulating film. The method includes forming a piercing portion reaching the substrate in a portion of the stacked body. The semiconductor pillar is not formed in the portion. The method includes forming spaces by removing the first films through the piercing portion. The method includes forming lower electrode films in the spaces.

First Embodiment

First, a first embodiment will be described.

Figure 1:
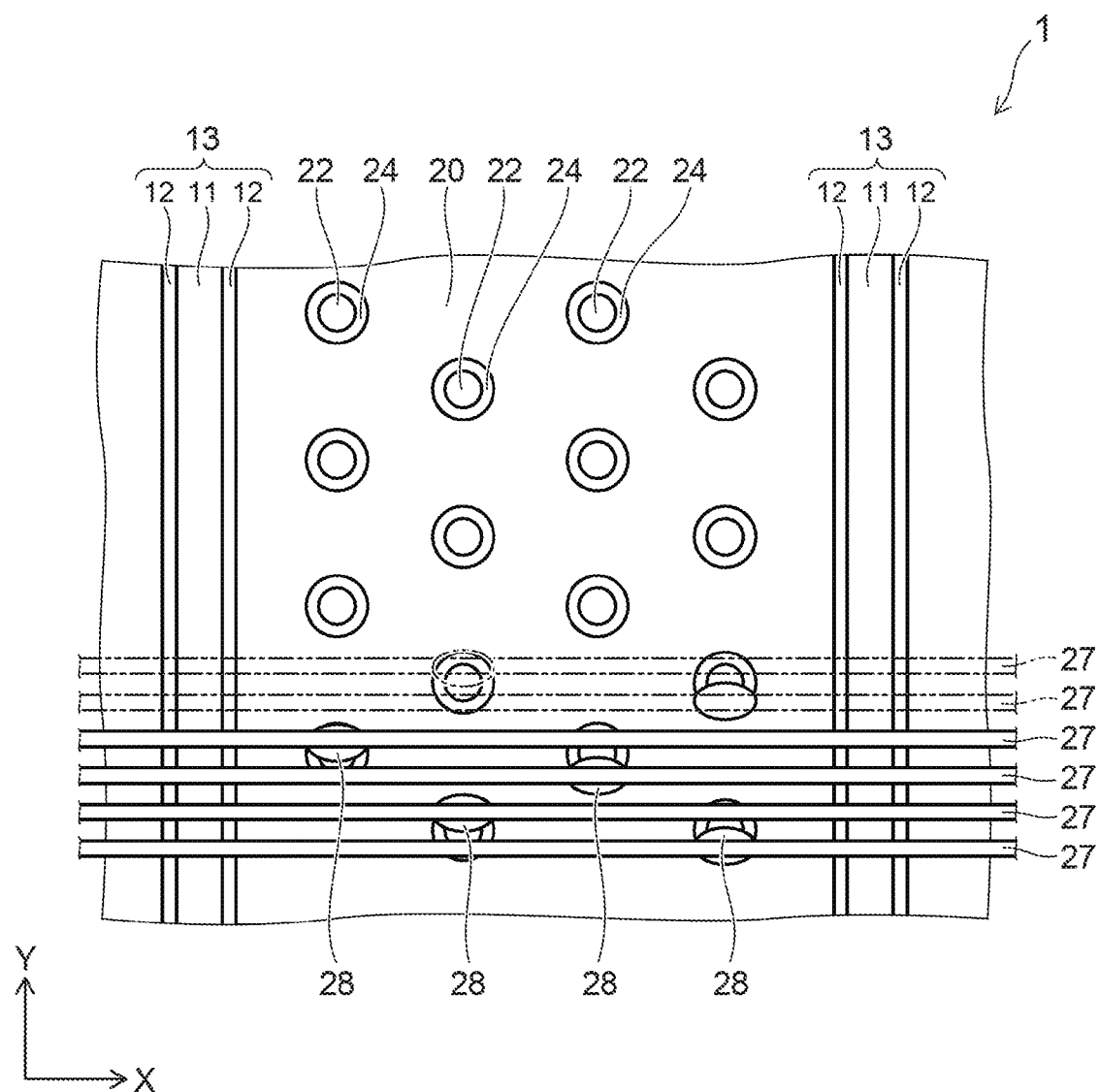
FIG. 1 is a plan view showing a semiconductor memory device according to a first embodiment.

FIG. 1 is a plan view showing a semiconductor memory device according to the embodiment.

Figure 2:
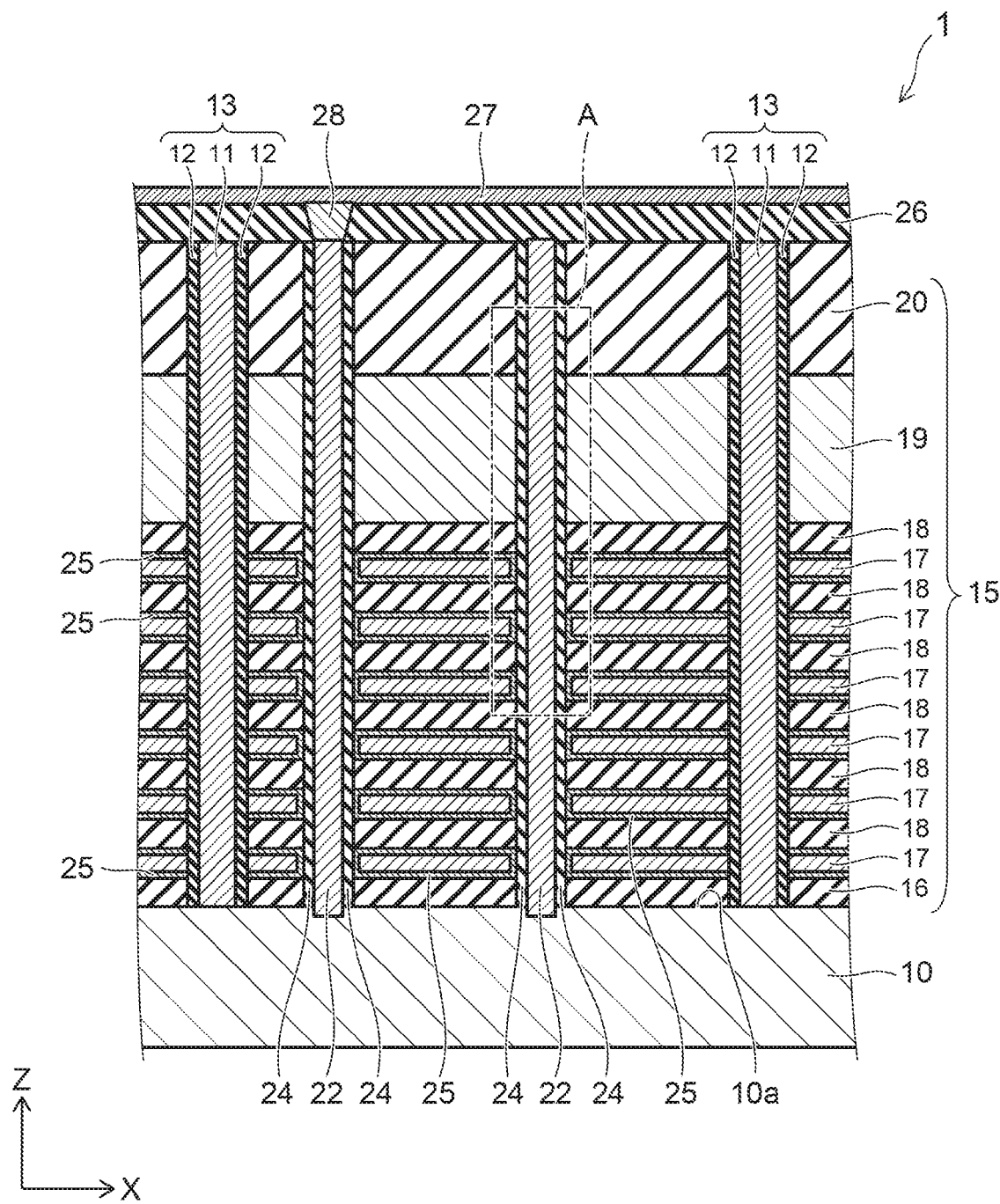
FIG. 2 is a sectional view showing the semiconductor memory device according to the first embodiment.

FIG. 2 is a sectional view showing the semiconductor memory device according to the embodiment.

Figure 3:
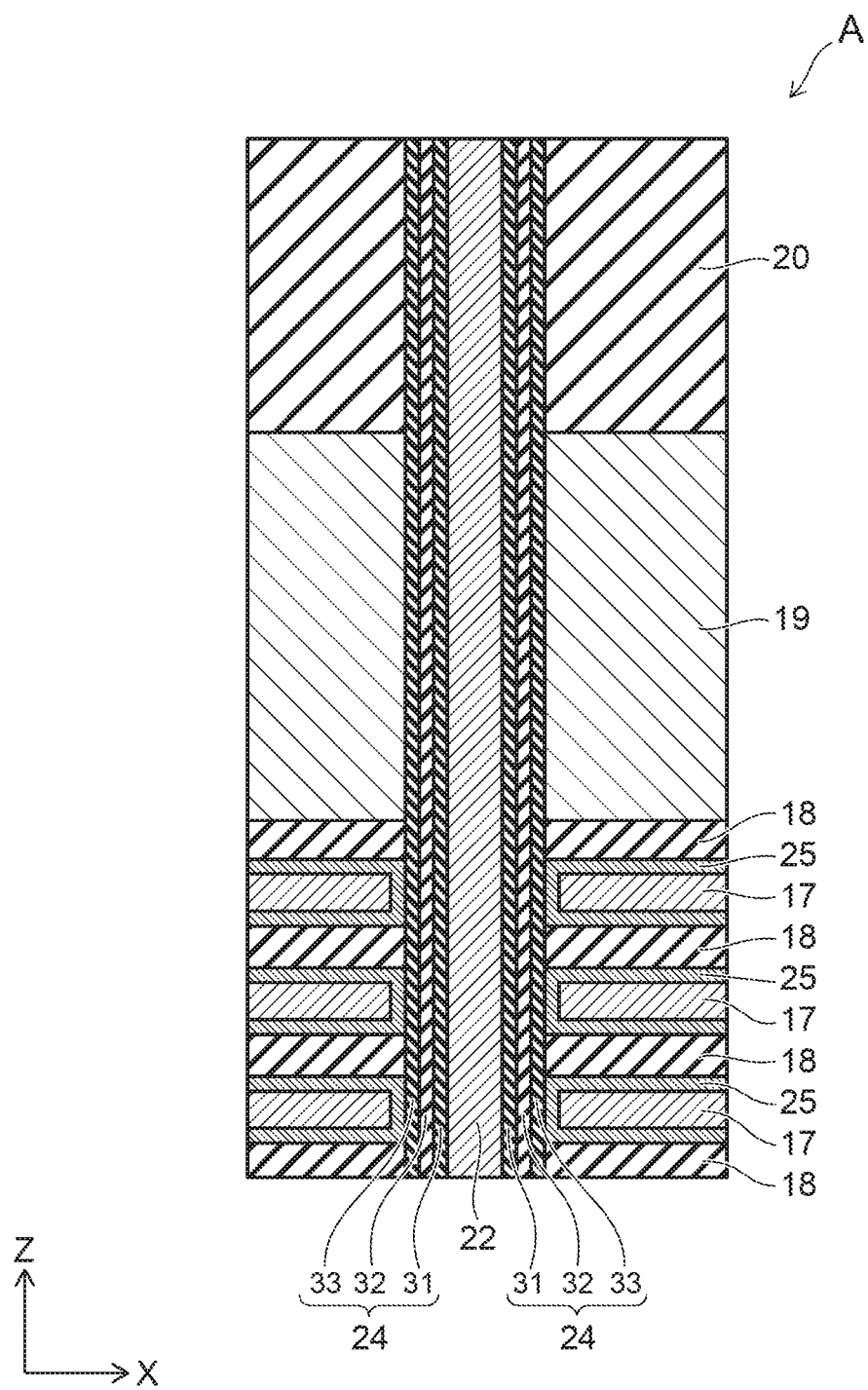
FIG. 3 is an enlarged sectional view showing an area A of FIG. 2.

FIG. 3 is an enlarged sectional view showing an area A of FIG. 2.

Figure 4:
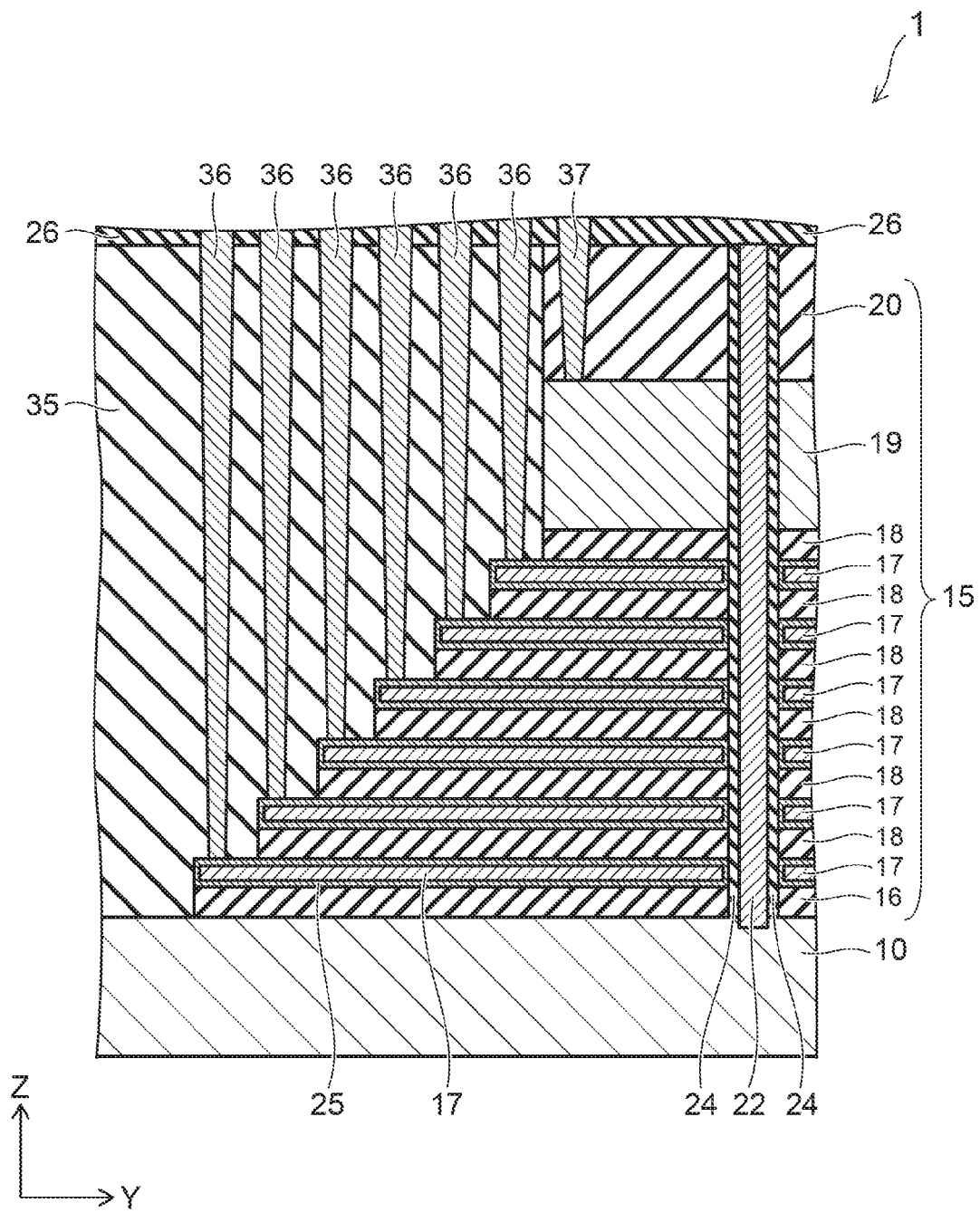
FIG. 4 is a sectional view showing the semiconductor memory device according to the first embodiment.

FIG. 4 is a sectional view showing the semiconductor memory device according to the embodiment.

Figure 5A:
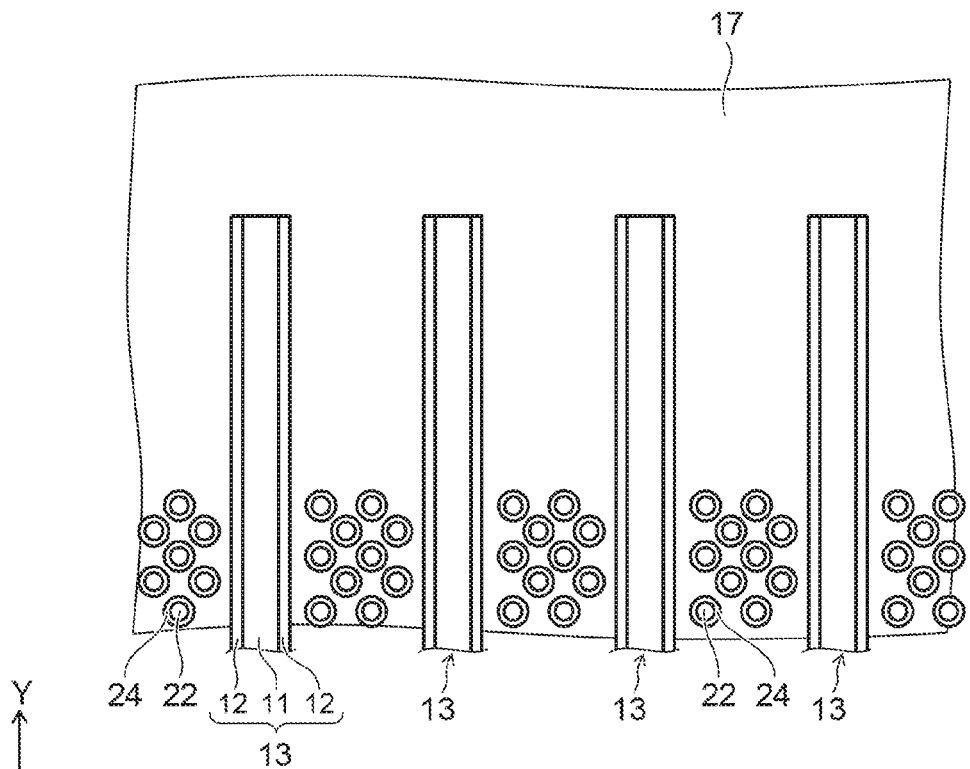
FIG. 5A and FIG. 5B are schematic plan views showing electrode films in the first embodiment.
Figure 5B:
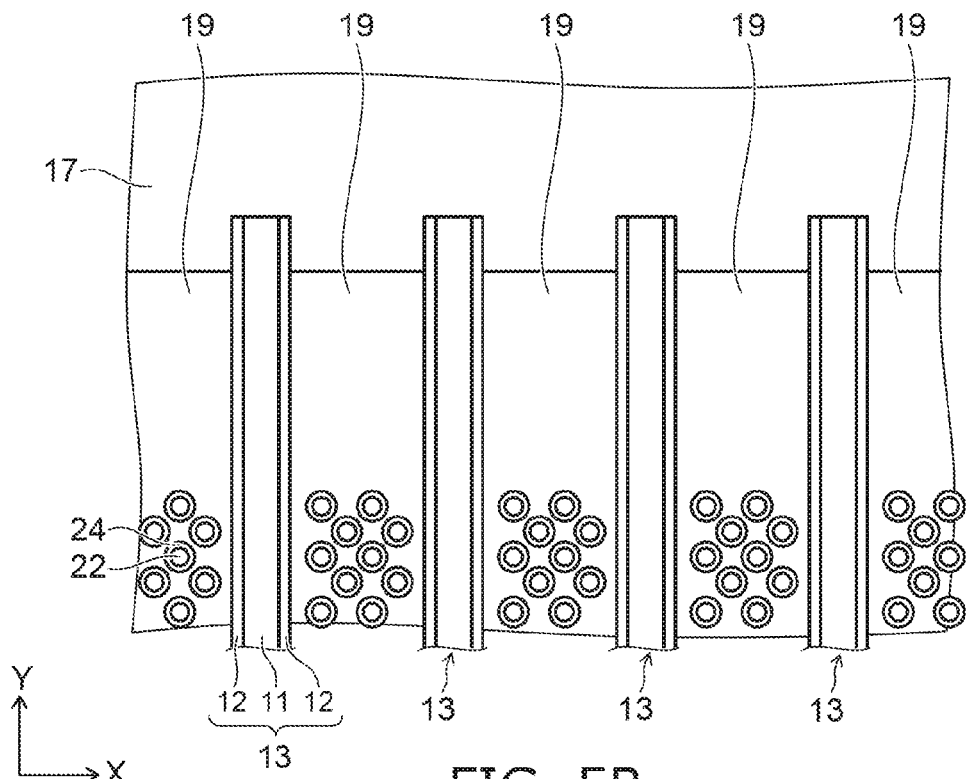

FIG. 5A and FIG. 5B are schematic plan views showing electrode films in the embodiment.

The semiconductor memory device according to the embodiment is a three-dimensionally stacked-type nonvolatile memory device.

As shown in FIG. 1 and FIG. 2, in the semiconductor memory device 1 according to the embodiment, a silicon substrate 10 is provided. Hereinafter, in the specification, an XYZ orthogonal coordinate system is employed for convenience of explanation. Two directions parallel to an upper surface 10a of the silicon substrate 10 and orthogonal to each other are defined as an "X-direction" and a "Y-direction", and a direction vertical to the upper surface 10a of the silicon substrate 10 is defined as a "Z-direction". The silicon substrate 10 is formed of, for example, a single crystal of silicon. An impurity is introduced into an upper layer portion of the silicon substrate 10, so that the upper layer portion is conductive or semiconductor.

On the silicon substrate 10, a plurality of source electrode plates 11 is provided separated from each other in the X-direction and parallel to each other at, for example, substantially equal intervals. The source electrode plate 11 is formed of, for example, tungsten (W). The shape of the source electrode plate 11 is a plate shape with the longest longitudinal direction thereof being the Y-direction, the second longest width direction being the Z-direction, and the shortest thickness direction being the X-direction. Silicon oxide plates 12 having a plate shape are provided on side surfaces of the source electrode plate 11 facing both sides thereof in the X-direction. A source electrode structure 13 is configured of one source electrode plate 11 and two silicon oxide plates 12 provided on the both side surfaces of the source electrode plate 11. A lower end of the source electrode plate 11 is connected to the silicon substrate 10.

Stacked bodies 15 are provided on the silicon substrate 10, each between the source electrode structures 13 adjacent to each other. Accordingly, the plurality of stacked bodies 15 is arranged along the X-direction on the silicon substrate 10. As will be described later, an edge portion of the stacked body 15 in the Y-direction has a stepped shape, and lower portions of the stacked bodies 15 are connected to each other.

In the stacked body 15, a silicon oxide film 16 is provided on the silicon substrate 10. In the specification, the "silicon oxide film" refers to a film containing silicon oxide as a main component. Accordingly, the silicon oxide film 16 contains silicon (Si) and oxygen (O). Moreover, since silicon oxide is generally an insulating material, the silicon oxide film is an insulating film unless otherwise described. The same applies to other configuration elements, and when the name of a material is included in the name of a configuration element, the main component of the configuration element is the material.

A plurality of electrode films 17 and a plurality of silicon oxide films 18 are alternately stacked on the silicon oxide film 16. The electrode film 17 is formed of a metal material, for example, tungsten. An electrode film 19 is provided on the silicon oxide film 18 at the uppermost stage. The electrode film 19 is formed of, for example, the same metal material as the electrode film 17, and is formed of, for example, tungsten. In the Z-direction, the electrode film 19 is thicker than the electrode film 17. A silicon oxide film 20 is provided on the electrode film 19. In this manner, the silicon oxide film 16, the plurality of electrode films 17, the plurality of silicon oxide films 18, the electrode film 19, and the silicon oxide film 20 are stacked along the Z-direction, so that the stacked body 15 is formed.

Silicon pillars 22 extending in the Z-direction are provided in the stacked body 15. The silicon pillar 22 is made of polysilicon, and the shape thereof is a circular cylinder shape. A lower end of the silicon pillar 22 is connected to the silicon substrate 10, and an upper end is exposed in an upper surface of the silicon oxide film 20. The silicon pillar 22 may have a circular tubular shape with the lower end thereof being closed, and a core member made of, for example, silicon oxide may be provided in the interior thereof. As viewed from the Z-direction, the silicon pillars 22 are periodically arranged along plural rows, for example, four rows. Each of the rows extends in the Y-direction, and the position of the silicon pillar 22 in the Y-direction is shifted by half a period between the rows adjacent to each other. In the specification, such an arrangement is referred to as a "four-row stagger". A memory film 24 is provided between the silicon pillar 22 and the stacked body 15. The memory film 24 is a film that can store electrical charges.

As shown in FIG. 3, in the memory film 24, a tunnel film 31, a charge trap film 32, and a block film 33 are stacked in this order from a side of the silicon pillar 22 toward a side of the stacked body 15. The tunnel film 31 is a film that is normally insulating but allows a tunnel current to flow therethrough when a predetermined voltage within the range of a drive voltage of the semiconductor memory device 1 is applied. The tunnel film 31 is, for example, a silicon oxide film of a single layer, or an ONO film in which a silicon oxide layer, a silicon nitride layer, and a silicon oxide layer are stacked in this order. The charge trap film 32 is a film capable of storing electrical charges, is formed of a material having an electron trapping site, and is formed of, for example, silicon nitride. The block film 33 is a film that does not substantially allow a current to flow therethrough even when a voltage is applied within the range of the drive voltage of the semiconductor memory device 1. The block film 33 is, for example, a silicon oxide film of a single layer, or a multi-layer film in which a metal oxide layer such as an aluminum oxide layer or a hafnium oxide layer and a silicon oxide layer are stacked. For example, the average dielectric constant of the entire block film 33 is higher than the average dielectric constant of the entire tunnel film 31.

As shown in FIG. 2, in the semiconductor memory device 1, a lower select gate transistor is configured at each of crossing portions between the silicon pillars 22 and the electrode film 17 at the lowermost stage. The electrode film 17 at the lowermost stage, which configured the lower select gate transistor, functions as a lower select gate line. Moreover, at each of crossing portions between the silicon pillars 22 and the electrode films 17 except for the electrode film 17 at the lowermost stage, a memory cell transistor with the memory film 24 interposed between the silicon pillar 22 and the electrode film 17 is configured. The electrode film 17 configuring the memory cell transistor functions as a word line. The lower select gate transistor may include the electrode films 17 at plural stages including the electrode film 17 at the lowermost stage and continuously arranged along the Z-direction. Further, an upper select gate transistor is configured at each of crossing portions between the silicon pillars 22 and the electrode film 19. The electrode film 19 functions as an upper select gate line.

Then, as shown in FIG. 2 and FIG. 3, a barrier metal layer 25 is provided between the electrode film 17 and the silicon oxide film 18 on the lower stage side of the electrode film 17, between the electrode film 17 and the silicon oxide film 18 on the upper stage side of the electrode film 17, and between the electrode film 17 and the memory film 24. The barrier metal layer 25 is a metal-containing layer containing metal, but the composition thereof is different from the composition of the electrode film 17. The barrier metal layer 25 is made of, for example, metal nitride, and is made of, for example, titanium nitride (TiN), tantalum nitride (TaN), or tungsten nitride (WN). In other words, the barrier metal layer 25 contains, for example, metal and nitrogen (N), and contains, for example, one or more kinds of metals selected from the group consisted of titanium, tantalum, and tungsten, and nitrogen. The resistivity of the barrier metal layer 25 is higher than the resistivity of the electrode film 17.

On the other hand, the barrier metal layer 25 is not provided between the electrode film 17 and the silicon oxide plate 12, and the electrode film 17 is in contact with the silicon oxide plate 12. Moreover, the barrier metal layer 25 is not provided on a surface of the electrode film 19, and the electrode film 19 is in contact with the memory film 24, the silicon oxide plate 12, the silicon oxide film 18, and the silicon oxide film 20.

A silicon oxide film 26 is provided on the stacked body 15, and a plurality of bit lines 27 extending in the X-direction is provided on the silicon oxide film 26. Plugs 28 are provided in the silicon oxide film 26, and each connects the silicon pillar 22 with the bit line 27. In FIG. 1, the silicon oxide film 26 is omitted for convenience of showing the drawing. Moreover, only some of the bit lines 27 and some of the plugs 28 are shown.

In this manner, the silicon pillar 22 is connected between the bit line 27 and the silicon substrate 10. Moreover, a plurality of memory cell transistors is connected in series along each of the silicon pillars 22, and the lower select gate transistor and the upper select gate transistor are connected at both ends of the silicon pillar 22. Due to this, a NAND string in which the upper select gate transistor, the plurality of memory cell transistors, and the lower select gate transistor are connected in series is formed between the bit line 27 and the silicon substrate 10. Moreover, when the upper layer portion of the silicon substrate 10 is semiconductor, a predetermined voltage is applied to the electrode film 17 at the lowermost layer to thereby induce carriers at the surface of the silicon substrate 10 for establishing electrical continuity, and thus the silicon pillar 22 may be electrically connected to the source electrode plate 11.

As shown in FIG. 4, the shape of the edge portion of the stacked body 15 in the Y-direction is a stepped shape in which a step is formed at the electrode film 19 and each of the electrode films 17. That is, the plurality of electrode films 17 extends in the Y-direction beyond the electrode film 19; and in the plurality of electrode films 17, the lower the stage at which the electrode film 17 is disposed, the further the electrode film 17 extends in the Y-direction. For this reason, in an area directly on an edge portion of each of the electrode films 17 in the Y-direction, the other electrode films 17 and the electrode film 19 are not disposed. The edge portion of the stacked body 15 in the Y-direction is covered with a silicon oxide film 35. The silicon oxide film 26 is provided on the silicon oxide film 35. Contacts 36 and 37 extending in the Z-direction are provided in the silicon oxide film 35 and in the silicon oxide film 26. The contacts 36 are connected to the edge portions of the electrode films 17 in the Y-direction. Moreover, the contact 37 is connected to the edge portion of the electrode film 19 in the Y-direction.

As shown in FIG. 5A, a plurality of electrode films 17 located in the same position in the Z-direction and arranged in the X-direction with the source electrode structures 13 each interposed therebetween is connected to each other at one edge portion in the Y-direction. For example, as viewed from the Z-direction, the shape of the entire plurality of electrode films 17 connected to each other is a comb shape. On the other hand, as shown in FIG. 5B, a plurality of electrode films 19 arranged in the X-direction with the source electrode structures 13 each interposed therebetween is separated from each other and insulated from each other. For example, as viewed from the Z-direction, the shape of the electrode films 19 is a line-and-space shape. In this case, one electrode film 19 and portions disposed in areas directly on and directly below the electrode film 19 in the stacked body 15 are referred to as a "finger".

Next, a method for manufacturing the semiconductor memory device according to the embodiment will be described.

FIG. 6 to FIG. 12 are sectional views showing the method for manufacturing the semiconductor memory device according to the embodiment.

Figure 6:
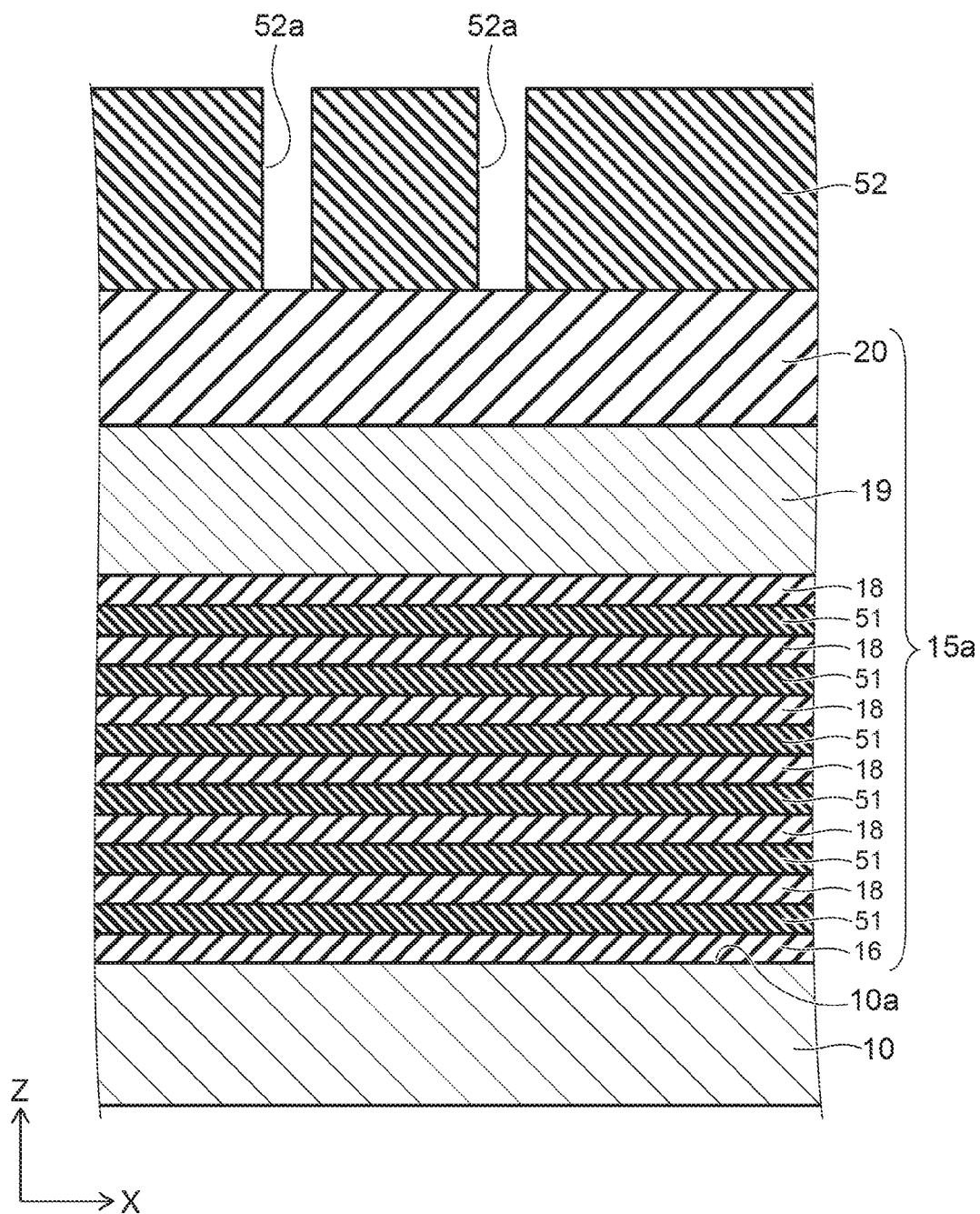
FIG. 6 to FIG. 12 are sectional views showing the method for manufacturing the semiconductor memory device according to the first embodiment.

First, as shown in FIG. 6, the silicon substrate 10 is prepared. Next, the silicon oxide film 16 is formed on the silicon substrate 10. Next, silicon nitride films 51 and the silicon oxide films 18 are alternately formed on the silicon oxide film 16 to form a stacked film. The silicon oxide film 18 lies at the uppermost stage of this stacked film. For convenience of showing the drawing, only six pairs, each of which is composed of the silicon nitride film 51 and the silicon oxide film 18, are shown in FIG. 6; however, the number of pairs is not limited to this, and, for example, several tens of pairs may be stacked.

Next, tungsten is deposited by, for example, a sputtering method to form the electrode film 19. The thickness of the electrode film 19 is made thicker than the thickness of the silicon nitride film 51, and set to be, for example, appropriately the same as the total thickness of four silicon nitride films 51 and three silicon oxide films 18. Next, the silicon oxide film 20 is formed on the electrode film 19 by, for example, a CVD (Chemical Vapor Deposition) method using TEOS (Tetra Ethyl Ortho Silicate: $Si(OC_2H_5)_4$) as a raw material. The silicon oxide film 20 is made thicker than the silicon oxide film 18, and set to have a thickness of, for example, several hundreds nm (nanometer) or more. Due to this, a stacked body 15a including the silicon oxide film 16, the plurality of silicon nitride films 51, the plurality of silicon oxide films 18, the electrode film 19, and the silicon oxide film 20 is formed on the silicon substrate 10.

Next, as shown in FIG. 4, a resist mask (not shown) is formed on the silicon oxide film 20. Then, by alternately carrying out etching using this resist mask as a mask and slimming of this resist mask, an edge portion of the stacked body 15a in the Y-direction is processed into a stepped shape. Next, the silicon oxide film 35 is formed on the entire surface, and the upper surface is planarized by CMP (Chemical Mechanical Polishing).

Next, as shown in FIG. 6, a mask film 52 is formed of a material containing carbon (C). Next, openings 52a having a circular shape as viewed from the Z-direction are formed in the mask film 52 by a lithography method in areas where the silicon pillars 22 and the memory films 24 (see FIG. 1 and FIG. 2) are to be formed.

Figure 7:
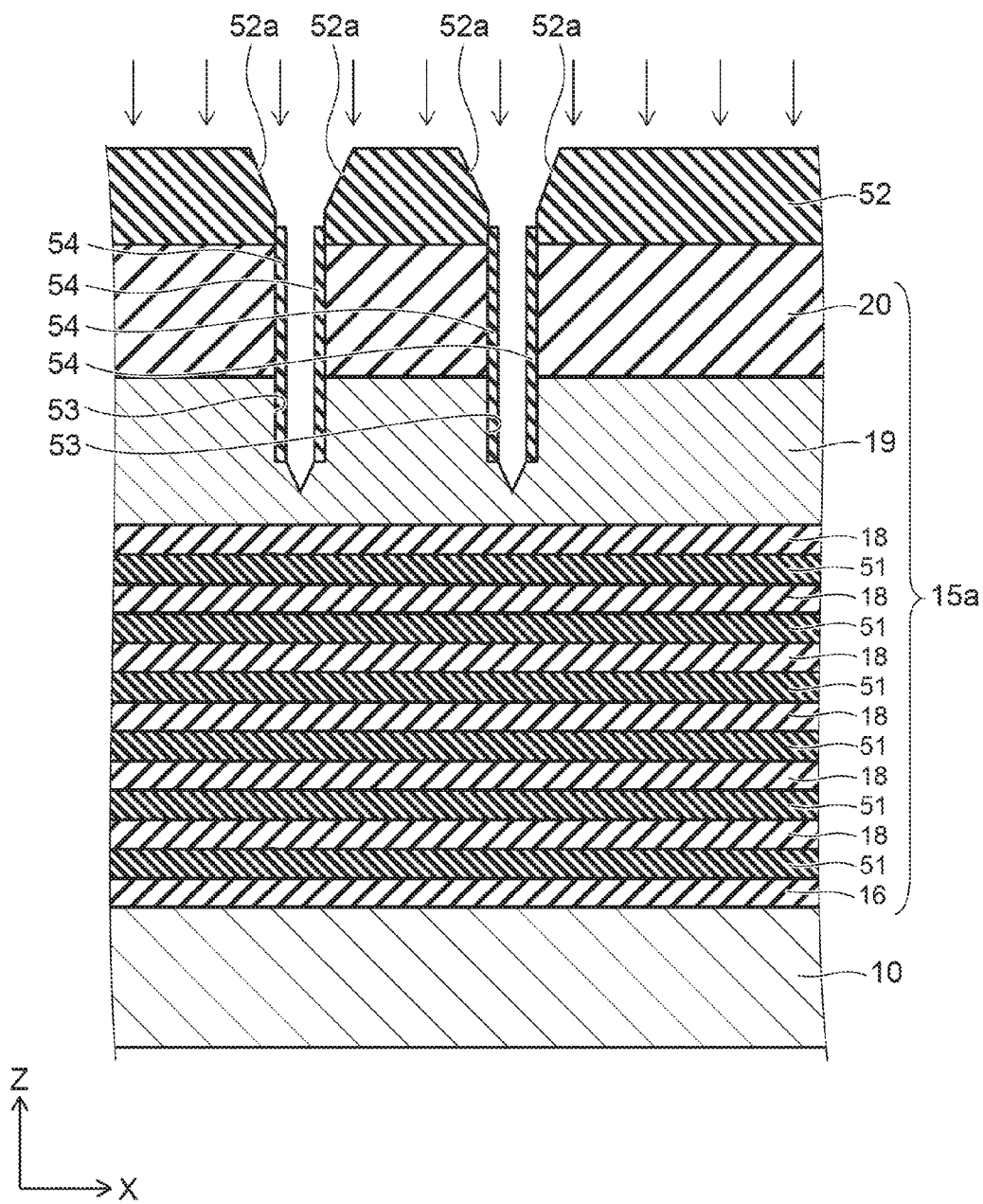

Next, as shown in FIG. 7, by applying RIE (Reactive Ion Etching) using the mask film 52 as a mask, the openings 52a of the mask film 52 are transferred to the stacked body 15a and memory holes 53 are formed. At this time, the mask film 52 is also etched and becomes thin entirely, and at the same time, an inner surface of the opening 52a is enlarged upward in a tapered shape.

In this etching, an etching gas containing carbon and fluorine is used for the silicon oxide film 20. For example, $C_4F_8$ or $C_4F_6$ is used as the etching gas. Etching using the etching gas containing carbon and fluorine has high selectivity to tungsten, so that the electrode film 19 is little etched. Therefore, when the electrode film 19 is exposed in the bottom of the memory hole 53 during formation, the supply of the etching gas containing carbon and fluorine is stopped.

Next, the supply of an etching gas containing fluorine and bromine is started. In one example, a pressure in a chamber is 8 mT (millitorr); a source power for forming plasma is 800 W (watt); and a bias power for drawing the plasma is 150 W. Moreover, as one example of the etching gas containing fluorine and bromine, a mixed gas containing nitrogen trifluoride ($NF_3$) supplied at a flow rate of 20 sccm, chlorine ($Cl_2$) supplied at a flow rate of 70 sccm, helium (He)

supplied at a flow rate of 150 sccm, oxygen ($O_2$) supplied at a flow rate of 10 sccm, and hydrogen bromide (HBr) supplied at a flow rate of 60 sccm is used. However, an optimum flow ratio of the gases varies depending on an etching condition, an etching apparatus, and the like.

The electrode film 19 made of tungsten is etched by the etching gas containing fluorine and bromine. At this time, a reaction product produced in the memory hole 53 contains tungsten bromide ($WBr_x$) and tungsten fluoride ($WF_x$). In these, tungsten fluoride has a high vapor pressure, and thus is exhausted as a gas through the memory hole 53 and easily discharged to the outside of a system. On the other hand, tungsten bromide has a low vapor pressure, and thus easily adheres to an inner surface of the memory hole 53. As a result of this, a protective film 54 containing tungsten bromide as a main component is formed on the inner surface of the memory hole 53. The protective film 54 is formed, not only in an area where the electrode film 19 is exposed in the inner surface of the memory hole 53, but also in an area where the silicon oxide film 20 is exposed. For example, the protective film 54 adheres up to an area several hundreds nm above a boundary between the electrode film 19 and the silicon oxide film 20. However, the protective film 54 hardly reaches an upper edge portion of the opening 52a, and therefore does not close an upper edge of the opening 52a.

By forming the protective film 54 on the inner surface of the memory hole 53, it is possible to allow etching to proceed downward while protecting exposed portions of the electrode film 19 and the silicon oxide film 20. The adhesion amount of the protective film 54 depends on the production amount of the reaction product, and the production amount of the reaction product can be controlled by the flow rate of hydrogen bromide (HBr). In general, as the flow rate of hydrogen bromide increases, the adhesion amount of the protective film 54 also increases. In contrast to this, tungsten fluoride ($WF_x$) has a high vapor pressure and is less adhesive; and therefore, in general, as the flow rate of nitrogen trifluoride ($NF_3$) increases, the value of a flow ratio $\{HBr/(HBr+NF_3)\}$ is reduced and the adhesion amount of the protective film 54 decreases.

Figure 8:
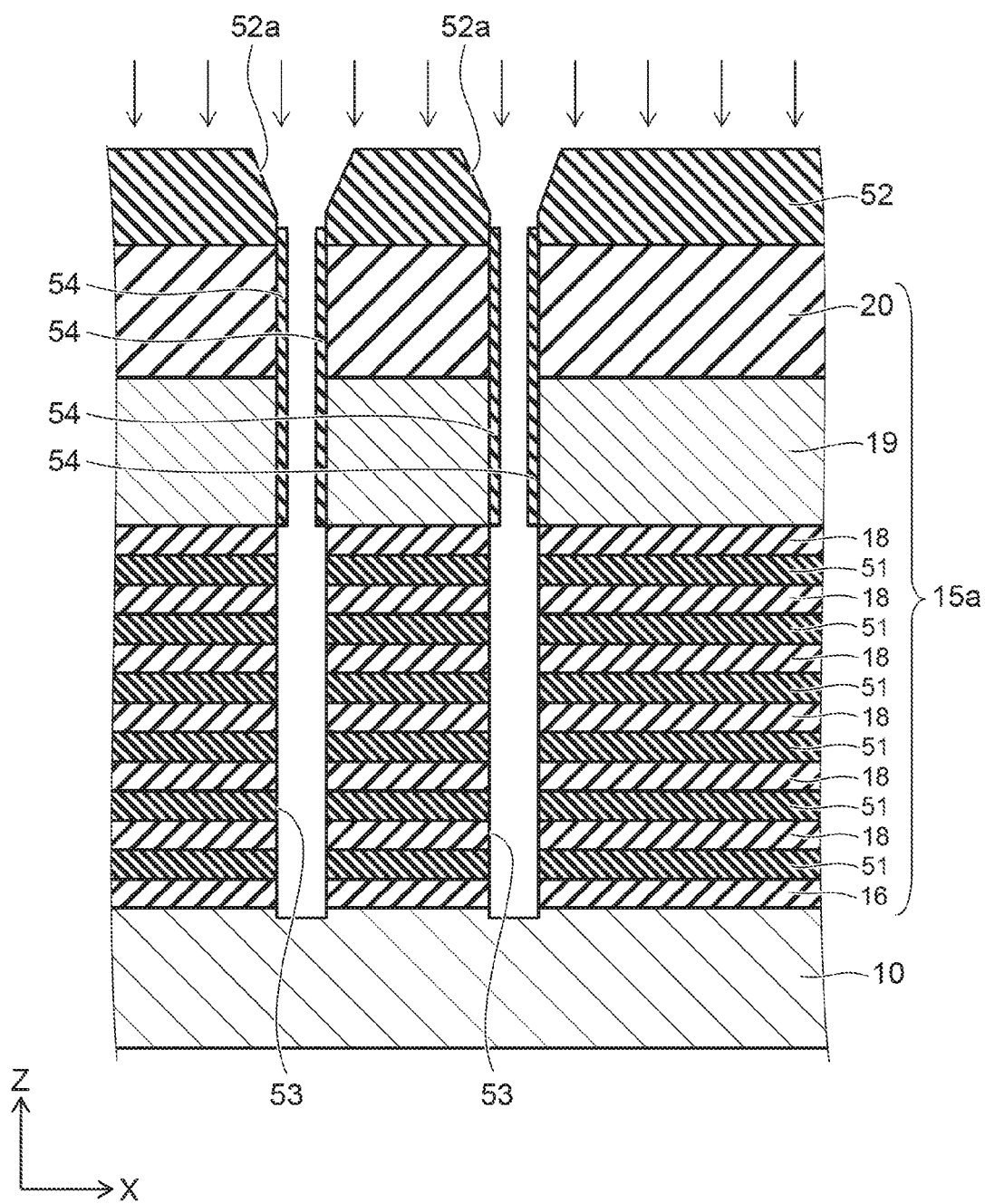

As shown in FIG. 8, when the memory hole 53 pierces the electrode film 19 and the silicon oxide film 18 is exposed in the bottom of the memory hole 53, the supply of the etching gas containing fluorine and bromine is stopped, and the supply of the etching gas containing carbon and fluorine is started. Due to this, etching of the silicon oxide film 18 and the silicon nitride film 51 proceeds.

At this stage, since tungsten is not present in the member to be etched, tungsten bromide is not produced. Accordingly, the protective film 54 is not formed on an area where the silicon oxide film 18 and the silicon nitride film 51 are exposed in the inner surface of the memory hole 53. On the other hand, the protective film 54 remains on a side surface of the electrode film 19 and on a side surface of the silicon oxide film 20. Since the protective film 54 contains tungsten, the protective film 54 is highly resistant to the etching gas containing carbon and fluorine, and hardly disappears.

Due to this, it is possible, during the etching of the silicon oxide film 18 and the silicon nitride film 51, to inhibit ions recoiling on a tapered portion in the inner surface of the opening 52a of the mask film 52 from impinging on exposed surfaces of the electrode film 19 and the silicon oxide film 20 and side-etching the electrode film 19 and the silicon oxide film 20. As a result of this, it is possible to downwardly etch the silicon oxide film 18, the silicon nitride film 51, and the silicon oxide film 16 while inhibiting a portion that pierces the electrode film 19 and the silicon oxide film 20 in the memory hole 53 from expanding due to side-etching and being formed into what is called a bowing shape.

When the memory hole 53 pierces the silicon oxide films 18, the silicon nitride films 51, and the silicon oxide film 16 to reach the silicon substrate 10, the etching is stopped. Due to this, the memory hole 53 piercing the stacked body 15a is formed. Thereafter, the mask film 52 is removed. Moreover, wet processing is applied to remove the protective film 54.

Figure 9:
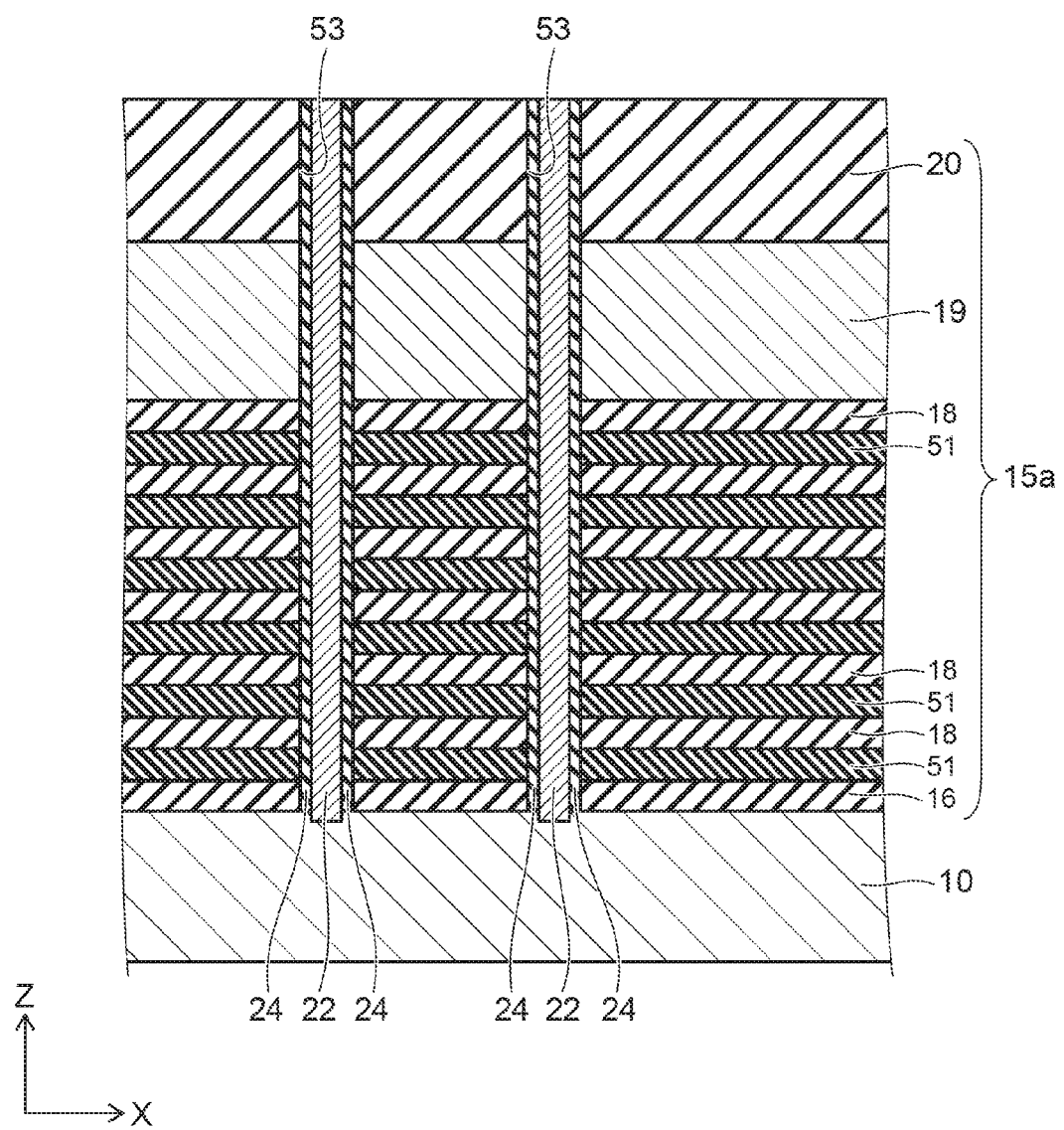

Next, as shown in FIG. 9 and FIG. 3, the block film 33, the charge trap film 32, and the tunnel film 31 are formed in this order on the inner surface of the memory hole 53 to thereby form the memory film 24. Next, silicon is deposited on a surface of the memory film 24 to thereby form a cover silicon layer. Next, the cover silicon layer and the memory film 24 are removed from a bottom surface of the memory hole 53 by, for example, a RIE method to expose the silicon substrate 10. Next, a silicon body is embedded in the memory hole 53 by depositing silicon. The silicon pillar 22 is formed of the cover silicon layer and the silicon body. The memory hole 53 may not be completely filled up with the silicon body, and thereafter, a core member made of silicon oxide may be formed by depositing silicon oxide.

Figure 10:
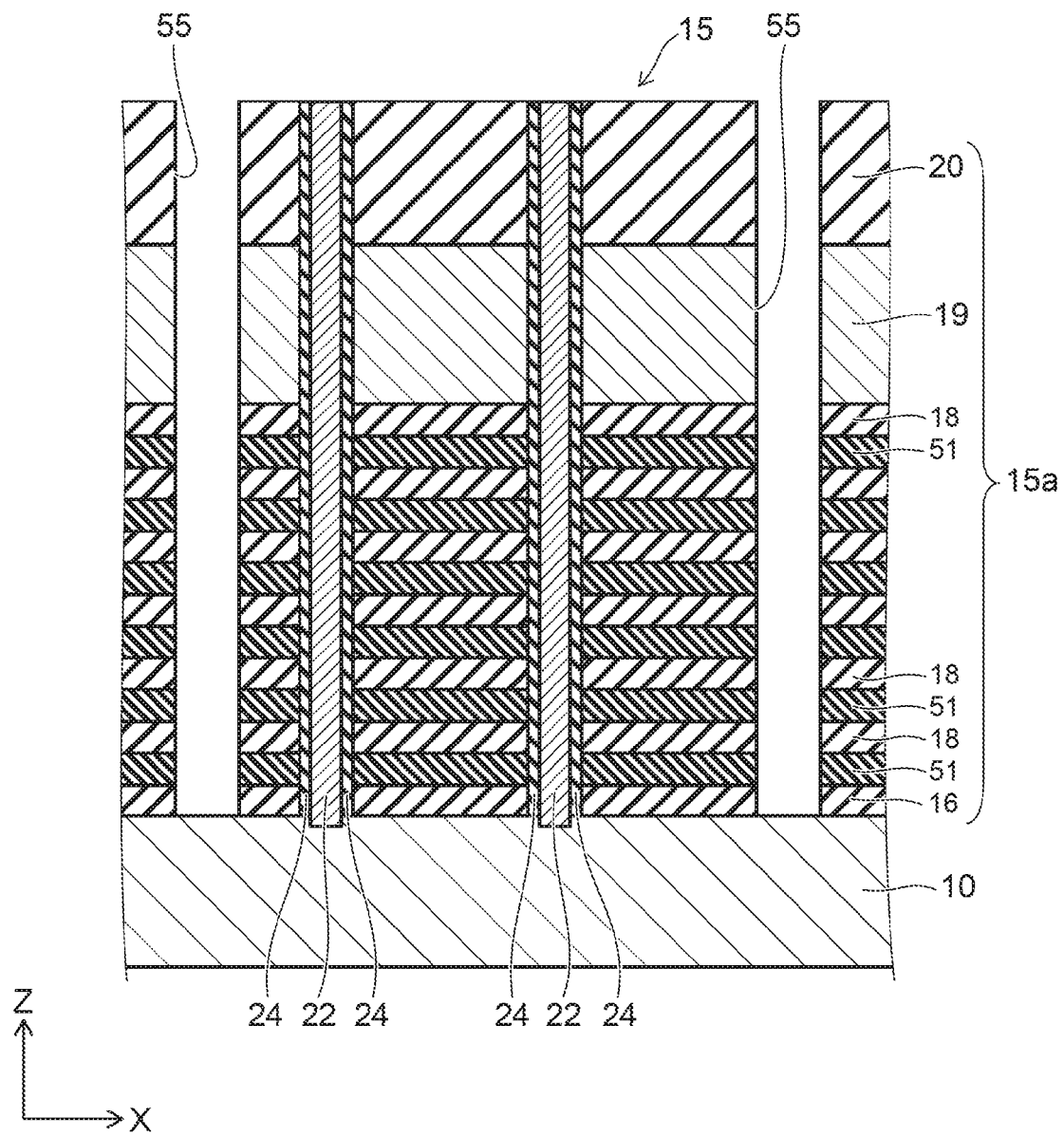

Next, as shown in FIG. 10, a mask film (not shown) is formed by a lithography method, and RIE is applied using this mask film, to thereby form a plurality of trenches 55 extending in the Y-direction in a portion where the silicon pillar 22 and the memory film 24 are not formed in the stacked body 15a. The etching at this time can be performed by, for example, a method similar to the etching of the memory hole 53 described above. The plurality of trenches 55 is periodically arranged along the X-direction, and terminated not to separate the silicon nitride films 51 into the "finger" at one edge portion in the Y-direction in the stacked body 15a. Each of the trenches 55 is made to reach the silicon substrate 10. Due to this, the silicon oxide film 16, the silicon nitride films 51, the silicon oxide films 18, the electrode film 19, and the silicon oxide film 20 are exposed in a side surface of the trench 55. The electrode film 19 is divided by the trenches 55 into a plurality of stripe-shaped portions. On the other hand, the silicon nitride film 51 is processed into a comb shape in which edge portions in the Y-direction are connected to each other. A portion interposed between the trenches 55 in the stacked body 15a is defined as the stacked body 15. Accordingly, a plurality of stacked bodies 15 is arranged along the X-direction.

Figure 11:
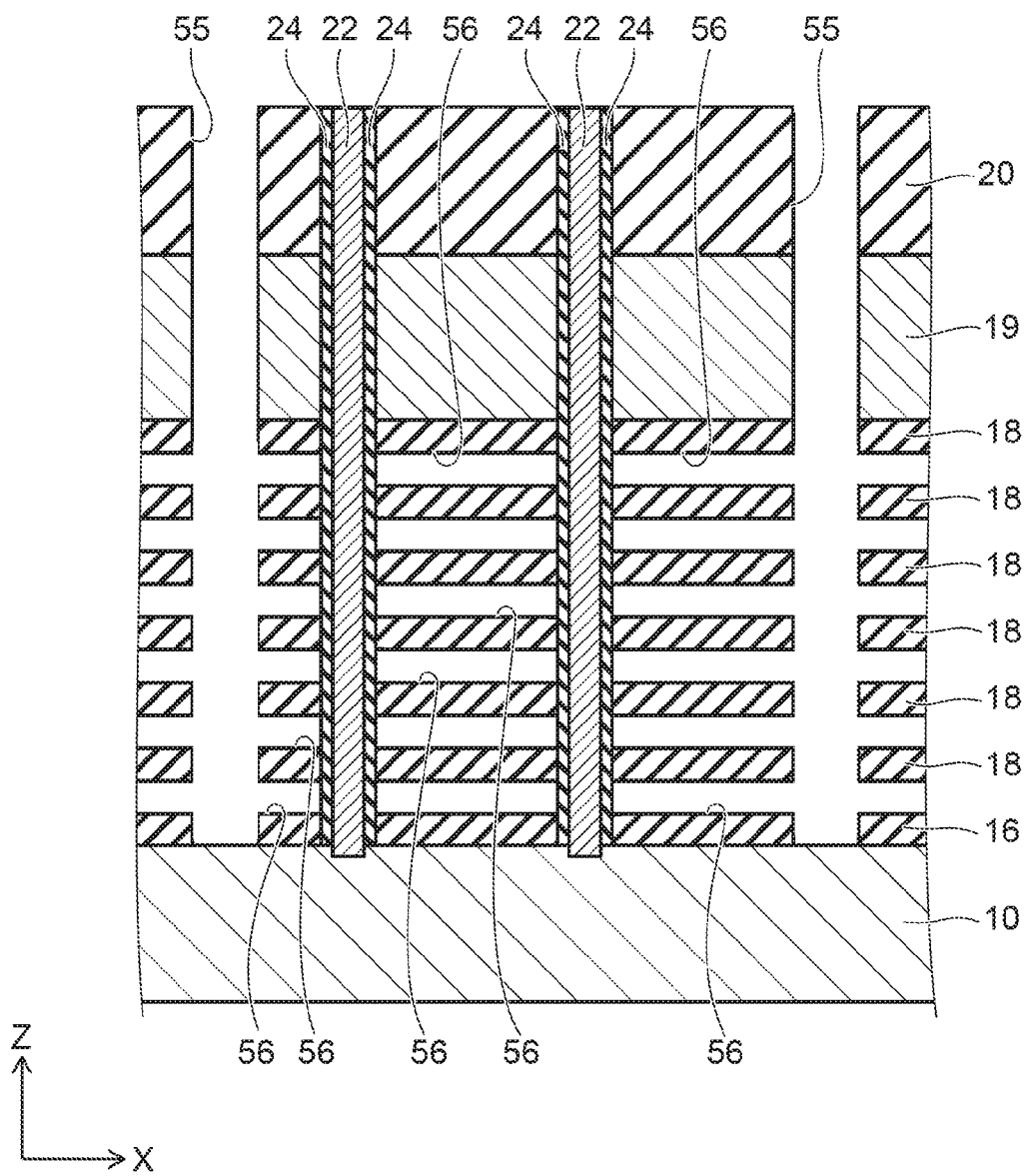

Next, as shown in FIG. 11, wet etching is applied through the trenches 55. The condition of this wet etching is a condition that silicon nitride is etched selectively over silicon oxide, and, for example, hot phosphoric acid is used as an etchant. Due to this, the silicon nitride films 51 (see FIG. 10) are removed through the trenches 55, and spaces 56 are formed. At this time, the silicon oxide films 16, 18, and 20 and the electrode film 19 are not substantially etched, and the silicon oxide film 18 is exposed in a lower surface and an upper surface of the space 56. Moreover, also the memory film 24 is not substantially etched, and is exposed in the space 56. The silicon pillar 22 surrounded by the memory film 24 supports the silicon oxide films 18 and the like, and prevents the spaces 56 from collapsing.

Figure 12:
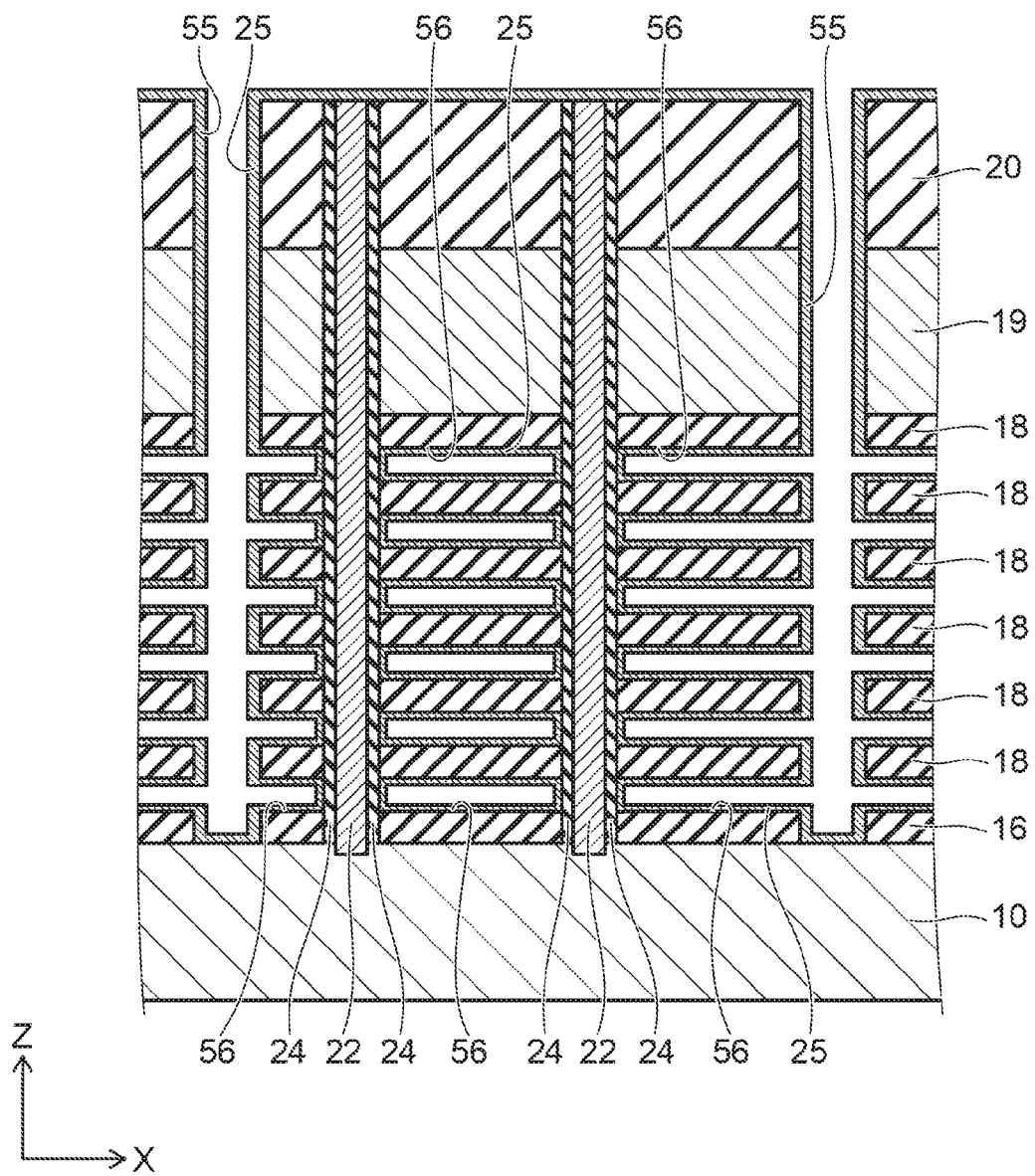

Next, as shown in FIG. 12, metal nitride, for example, titanium nitride, tantalum nitride, or tungsten nitride is deposited by, for example, a CVD method. Due to this, the barrier metal layer 25 is formed on inner surfaces of the trench 55 and the space 56. The barrier metal layer 25 is in contact with exposed areas in the silicon substrate 10, the silicon oxide films 16, 18, and 20, the electrode film 19, and the memory film 24. However, the barrier metal layer 25 is formed such that the trench 55 and the space 56 are not filled up with the barrier metal layer 25.

Next, as shown in FIG. 2, by, for example, a CVD method using tungsten hexafluoride (WF$_6$) as a source gas and using diborane (B$_2$H$_6$) as a reducing gas, tungsten is deposited to be embedded in the space 56. At this time, the tungsten is also deposited on the side surface of the trench 55. Next, portions of the barrier metal layer 25 and the tungsten, which are deposited in the trench 55, are removed by applying etching. At this time, the tungsten deposited in the spaces 56 is allowed to remain. Due to this, the tungsten embedded in the spaces 56 is divided for each of the spaces 56, so that the electrode films 17 at plural stages are formed. Moreover, the barrier metal layer 25 remains between the electrode film 17 and the silicon oxide film 18 and between the electrode film 17 and the memory film 24, but does not remain on the surface of the electrode film 19.

Next, silicon oxide is deposited on the inner surface of the trench 55. Next, a portion, deposited on a bottom surface of the trench 55, in the silicon oxide is removed. Due to this, the silicon oxide plate 12 is formed on the side surface of the trench 55, and at the same time, the silicon substrate 10 is exposed in the bottom surface of the trench 55. Next, a conductive material such as, for example, tungsten is embedded in the trench 55 to form the source electrode plate 11. Due to this, the source electrode structure 13 is formed in the trench 55.

Next, silicon oxide is deposited on the silicon oxide film 20 and on the silicon oxide film 35 to form the silicon oxide film 26. Next, by a lithography method and a RIE method, an opening is formed in an area, directly on the silicon pillar 22, in the silicon oxide film 26, and a conductive material is embedded in this opening, to thereby form the plug 28. The plug 28 is connected to the silicon pillar 22. Moreover, contact holes are formed in the silicon oxide film 26 and the silicon oxide film 35, and a conductive material is embedded in the interiors of the contact holes, to thereby form the contacts 36 and 37 (see FIG. 4). Next, the bit line 27 extending in the X-direction is formed on the silicon oxide film 26, and connected to the plug 28. In this manner, the semiconductor memory device 1 according to the embodiment is manufactured.

Next, advantages of the embodiment will be described.

In the embodiment, in the process shown in FIG. 6, after the silicon nitride films 51 and the silicon oxide films 18 are alternately stacked, the electrode film 19 made of tungsten is formed. Then, in the process shown in FIG. 7, the electrode film 19 is etched using the etching gas containing fluorine and bromine in forming the memory hole 53. Due to this, the reaction product containing tungsten bromide as a main component is produced, and this adheres to the side surface of the memory hole 53, so that the protective film 54 is formed. For this reason, in the process shown in FIG. 8, the protective film 54 protects the silicon oxide film 20 and the electrode film 19 in etching the silicon oxide film 18 and the silicon nitride film 51, and it is possible to inhibit the memory hole 53 from being formed into a bowing shape. As a result of this, even when the memory hole 53 having a high aspect ratio is formed, a diameter fluctuation can be inhibited. Due to this, the inside diameter of the electrode film 19 surrounding the silicon pillar 22 becomes stable, and switching characteristics of the upper select gate transistor become stable. Also for the memory cell transistor disposed relatively at an upper stage, the enlargement of the inside diameter of the electrode film 17 surrounding the silicon pillar 22 can be inhibited, and therefore, characteristics of the memory cell transistor become stable.

Moreover, in the embodiment, in the process shown in FIG. 6, the silicon oxide films 18 and the silicon nitride films 51 are stacked; in the process shown in FIG. 11, the silicon nitride films 51 are removed through the trenches 55; and in the process shown in FIG. 2, the electrode films 17 are embedded in the spaces 56 formed. For this reason, in the process shown in FIG. 8, since the memory hole 53 can be formed by etching the silicon oxide film 18 and the silicon nitride film 51 having close etching characteristics to each other, the memory hole 53 having a high aspect ratio can be accurately formed.

At this time, since the electrode film 17 is formed by embedding tungsten in the space 56, the barrier metal layer 25 is previously formed on the inner surface of the space 56 for ensuring the coverage of tungsten. However, as shown in FIG. 6, since the electrode film 19 is deposited on the silicon oxide film 18 which is flat, the barrier metal layer 25 is not needed. Since the barrier metal layer 25 is not provided, the electrode film 19 can be formed to be thick by an amount corresponding to the barrier metal layer 25, and the resistance of the electrode film 19 can be reduced. As a result of this, the driving speed of the semiconductor memory device 1 can be improved.

Further, in the embodiment, since the electrode film 19 is deposited on the silicon oxide film 18 which is flat, the electrode film 19 can be formed to be thick. Due to this, since the upper select gate line can be configured of one thick electrode film 19, the resistance of the upper select gate line can be reduced.

Furthermore, in the embodiment, since the electrode film 19 is formed by a sputtering method, the impurity concentration of the electrode film 19 is low. Also due to this, the resistance of the electrode film 19 can be reduced. If the electrode film 19 is formed of tungsten deposited by a CVD method, for example fluorine derived from tungsten hexafluoride (WF$_6$) used as a source gas and boron derived from diborane (B$_2$H$_6$) used as a reducing gas increase the resistance of the electrode film 19 as impurities in the electrode film 19.

Furthermore, in the embodiment, since only one electrode film 19 made of tungsten is provided, it is sufficient to change an etching gas only twice: once when the memory hole 53 reaches the electrode film 19, and once when the memory hole 53 pierces the electrode film 19, as shown in FIG. 7 and FIG. 8. For this reason, the semiconductor memory device according to the embodiment has high productivity.

Second Embodiment

Next, a second embodiment will be described.

Figure 13:
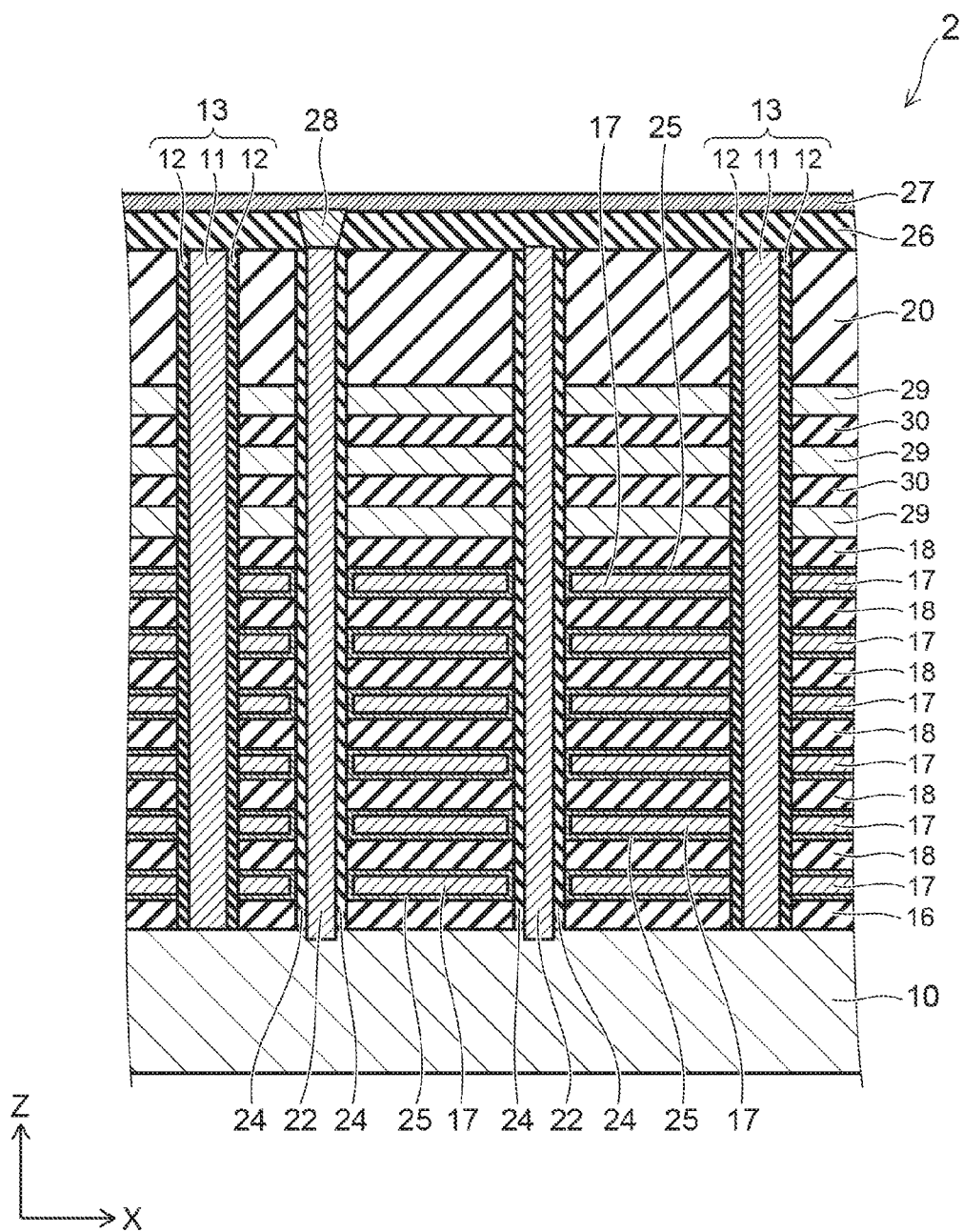
FIG. 13 is a sectional view showing a semiconductor memory device according to a second embodiment.

FIG. 13 is a sectional view showing a semiconductor memory device according to the embodiment.

As shown in FIG. 13, the semiconductor memory device 2 according to the embodiment is different, compared to the semiconductor memory device 1 (see FIG. 1) according to the first embodiment described above, in that a plurality of thin electrode films 29 is provided instead of one thick electrode film 19. The thickness of one electrode film 29 in the Z-direction is appropriately the same as the total thickness of one electrode film 17 and two barrier metal layers 25. A silicon oxide film 30 is provided between the electrode films 29. The plurality of electrode films 29 arranged along the Z-direction is electrically connected to each other in a not-shown area, and functions as one upper select gate line.

Similarly to the first embodiment described above, the electrode films 29 separated from each other in the X-direction with the source electrode structure 13 therebetween are not electrically connected to each other. On the other hand, the electrode films 17 separated from each other in the X-direction with the source electrode structure 13 therebetween are electrically connected to each other. The electrode films 17 function as the word lines and the lower select gate line.

The barrier metal layer 25 is not provided around the electrode film 29. For example, the electrode film 29 is in contact with the silicon oxide film 18, the silicon oxide film 20, the silicon oxide film 30, and the memory film 24. Moreover, configurations other than those described above in the semiconductor memory device 2 are similar to the first embodiment described above.

Although, in FIG. 13, an example in which the number of electrode films 29 is three has been shown, the number of electrode films 29 is not limited to this and may be two, four, or five or more.

Next, a method for manufacturing the semiconductor memory device according to the embodiment will be described.

Figure 14:
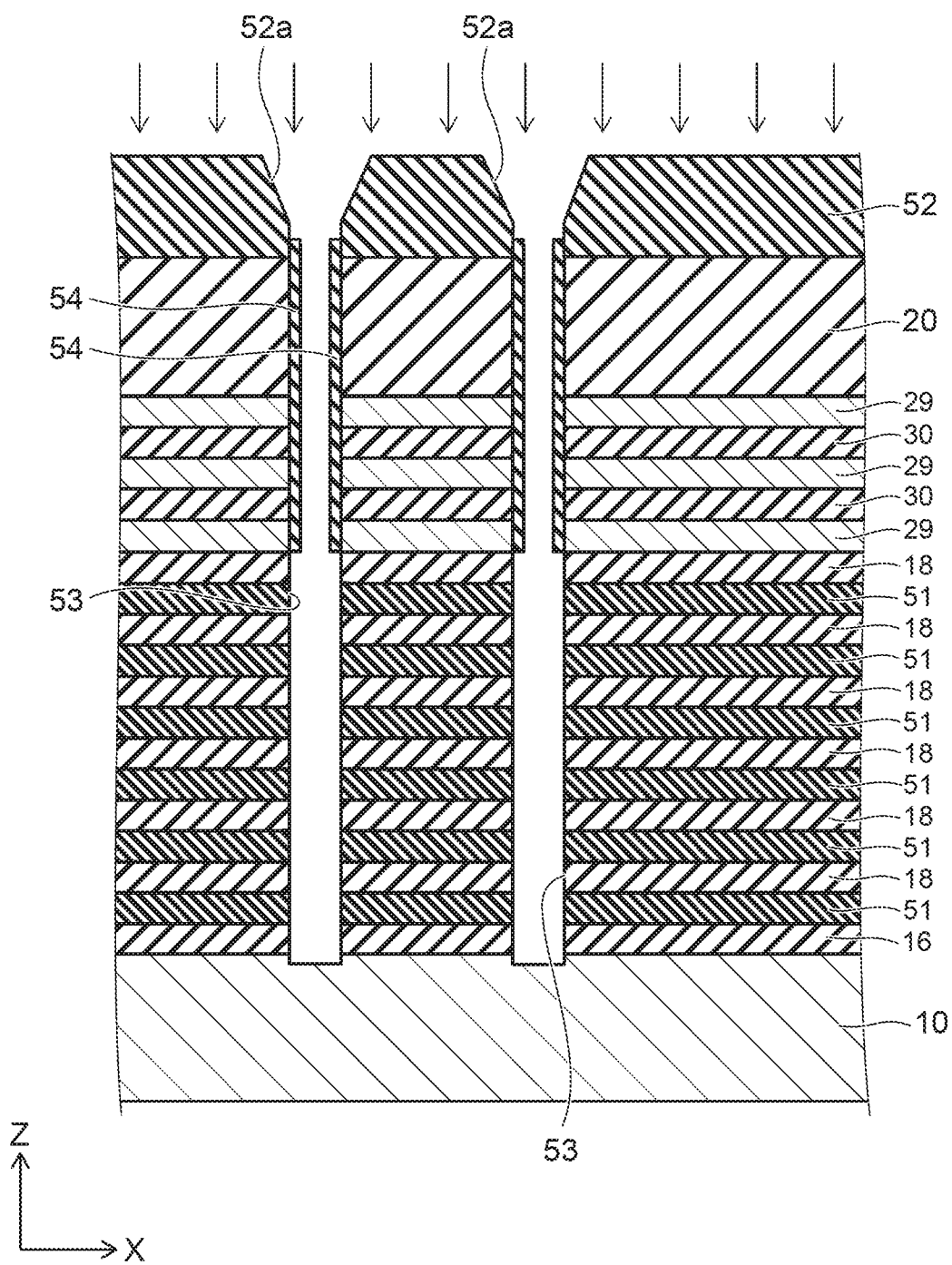
FIG. 14 is a sectional view showing the method for manufacturing the semiconductor memory device according to the second embodiment.

FIG. 14 is a sectional view showing the method for manufacturing the semiconductor memory device according to the embodiment.

First, as shown in FIG. 14, the silicon oxide film 16 is formed on the silicon substrate 10, and the silicon nitride films 51 and the silicon oxide films 18 are alternately stacked on the silicon oxide film 16.

Next, tungsten is deposited by, for example, a CVD method to form the electrode film 29. The thickness of the electrode film 29 is appropriately the same as the thickness of the silicon nitride film 51. Next, the silicon oxide film 30 is formed on the electrode film 29. The thickness of the silicon oxide film 30 is appropriately the same as the thickness of the silicon oxide film 18. After this, the electrode films 29 and the silicon oxide films 30 are alternately formed. The silicon oxide film 20 is formed on the electrode film 29 at the uppermost stage by a CVD method using TEOS as a raw material. Due to this, a stacked body is formed.

Next, as shown in FIG. 4, after an edge portion of the stacked body in the Y-direction is processed into a stepped shape, the silicon oxide film 35 is formed.

Next, as shown in FIG. 6, the mask film 52 formed with the openings 52a is formed on the silicon oxide film 20.

Next, as shown in FIG. 14, RIE is applied using the mask film 52 as a mask to form the memory hole 53. At this time, similarly to the first embodiment described above, an etching gas containing carbon and fluorine is used when the silicon oxide films 20, 30, 18, and 16 and the silicon nitride film 51 are etched; while an etching gas containing fluorine and bromine is used when the electrode film 29 made of tungsten is etched. Due to this, a reaction product containing tungsten bromide as a main component is produced when the electrode film 29 is etched, and this adheres to a side surface of the memory hole 53, so that the protective film 54 is formed. With the protective film 54, it is possible to inhibit the silicon oxide film 20, the electrode film 29, and the silicon oxide film 30 from being side-etched when etching the silicon oxide film 18 and the silicon nitride film 51. Subsequent processes are similar to the first embodiment described above.

Next, advantages of the embodiment will be described.

According also to the embodiment, by disposing the electrode film 29 made of tungsten in an upper portion of the stacked body similarly to the first embodiment described above, the protective film 54 is formed on an upper portion of the memory hole 53 in etching the electrode film 29 using the etching gas containing bromine, and it is possible to inhibit the memory hole 53 from being formed into a bowing shape. As a result of this, a diameter fluctuation of the memory hole 53 is reduced, and characteristics of the upper select gate transistor and the memory cell transistor become stable.

Moreover, since there is no need to provide the barrier metal layer 25 so as to be in contact with the electrode film 29, the electrode film 29 can be formed to be thick by an amount corresponding to the barrier metal layer 25, and the resistance of the electrode film 29 can be reduced. Configurations, manufacturing methods, and advantages other than those described above in the embodiment are similar to the first embodiment described above.

In the embodiment, an example in which the electrode films 29 are used as the upper select gate line and the electrode films 17 are used as the word lines and the lower select gate line has been shown, but the embodiment is not limited to this. For example, in the plurality of electrode films 29, one or more electrode films 29 from the lower stage side may be used as the word line; and in the plurality of electrode films 17, one or more electrode films 17 from the upper stage side may be used as the upper select gate line. In other words, in the Z-direction, a boundary between the upper select gate line and the word line may not necessarily coincide with a boundary between the electrode film 29 and the electrode film 17. The difference between the upper select gate line, and the word line and the lower select gate line lies in whether or not the electrode films are electrically connected to each other at the edge portion in the Y-direction as shown in, for example, FIG. 5A and FIG. 5B.

Third Embodiment

Next, a third embodiment will be described.

Figure 15:
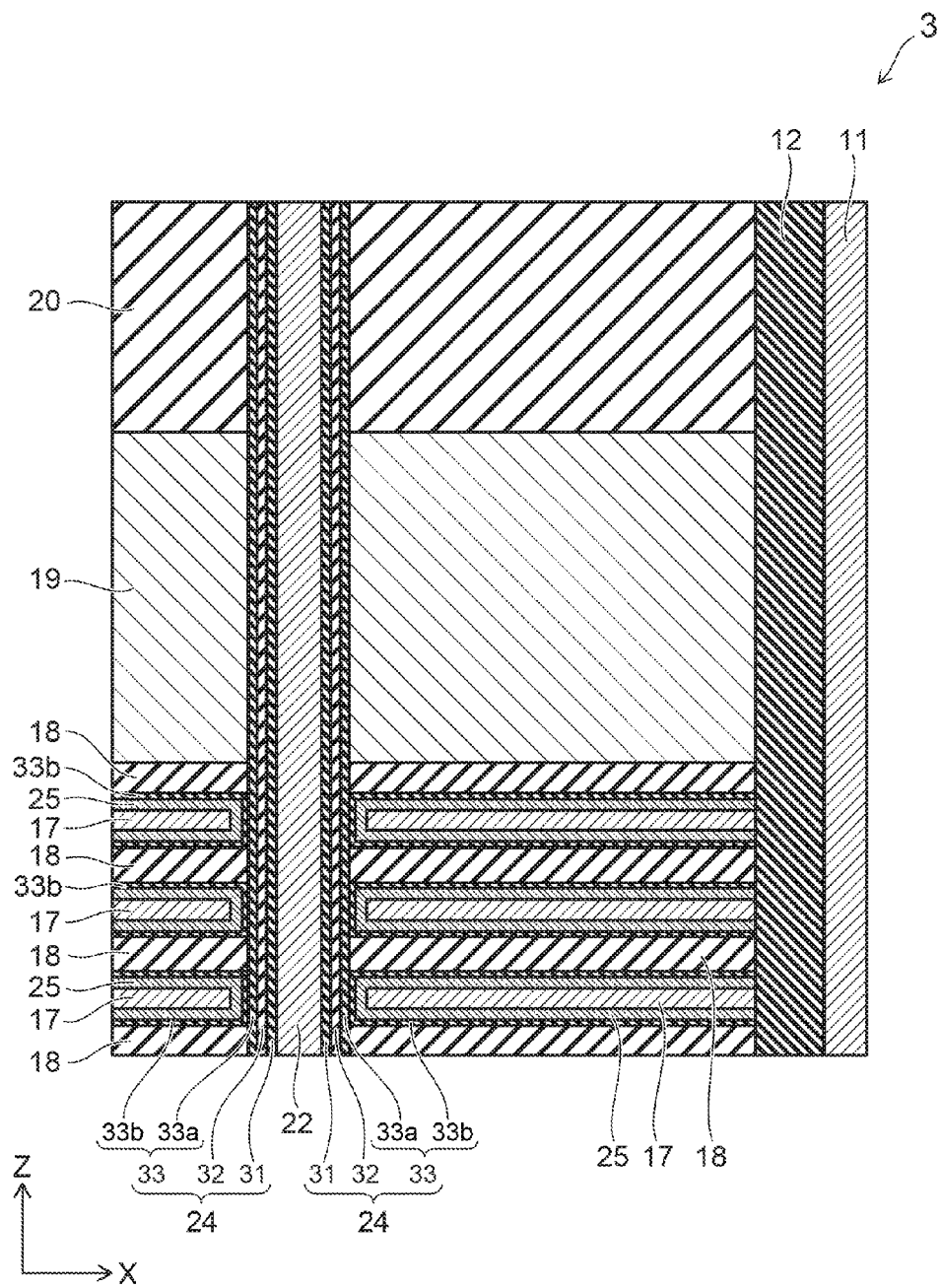
FIG. 15 is a sectional view showing a semiconductor memory device according to a third embodiment.

FIG. 15 is a sectional view showing a semiconductor memory device according to the embodiment.

As shown in FIG. 15, in the semiconductor memory device 3 according to the embodiment, a silicon oxide layer 33a and an aluminum oxide layer 33b are stacked in the block film 33. The dielectric constant of the aluminum oxide layer 33b is higher than the dielectric constant of the silicon oxide layer 33a. Instead of the aluminum oxide layer 33b, a high dielectric constant layer made of another insulating material having a dielectric constant higher than silicon oxide may be provided.

The silicon oxide layer 33a is provided on an outer side surface of the charge trap film 32, and the shape of the silicon oxide layer 33a is, for example, a circular tubular shape. The aluminum oxide layer 33b is provided on an outer surface of the barrier metal layer 25. Specifically, the aluminum oxide layer 33b is disposed between the barrier metal layer 25 and the silicon oxide film 18 and between the barrier metal layer 25 and the silicon oxide layer 33a. However, the aluminum oxide layer 33b is not disposed between the electrode film 17 and the silicon oxide plate 12 and between the silicon oxide film 18 and the silicon oxide plate 12. Moreover, the aluminum oxide layer 33b is not disposed between the electrode film 19 and the silicon oxide films 18 and 20 and between the electrode film 19 and the silicon oxide layer 33a.

For this reason, the tunnel film 31, the charge trap film 32, the silicon oxide layer 33a, the aluminum oxide layer 33b, and the barrier metal layer 25 are arranged in this order from the silicon pillar 22 toward the electrode film 17 between the silicon pillar 22 and the electrode film 17. On the other hand, the tunnel film 31, the charge trap film 32, and the silicon oxide layer 33*a* are arranged in this order from the silicon pillar 22 toward the electrode film 19 between the silicon pillar 22 and the electrode film 19. The electrode film 19 is in contact with the silicon oxide layer 33*a*.

Next, a method for manufacturing the semiconductor memory device according to the embodiment will be described.

Figure 16:
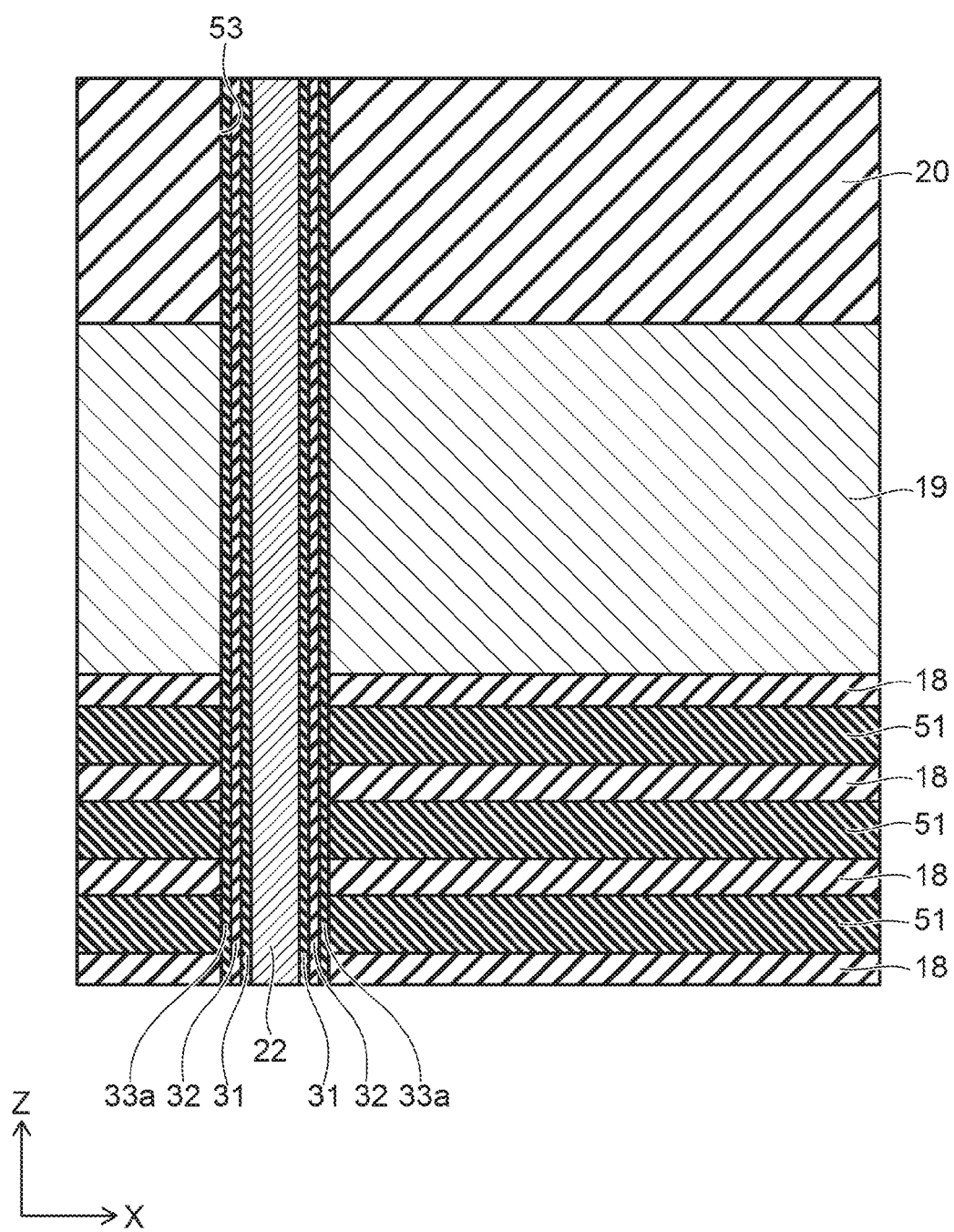
FIG. 16 and FIG. 17 are sectional views showing the method for manufacturing the semiconductor memory device according to the third embodiment.
Figure 17:
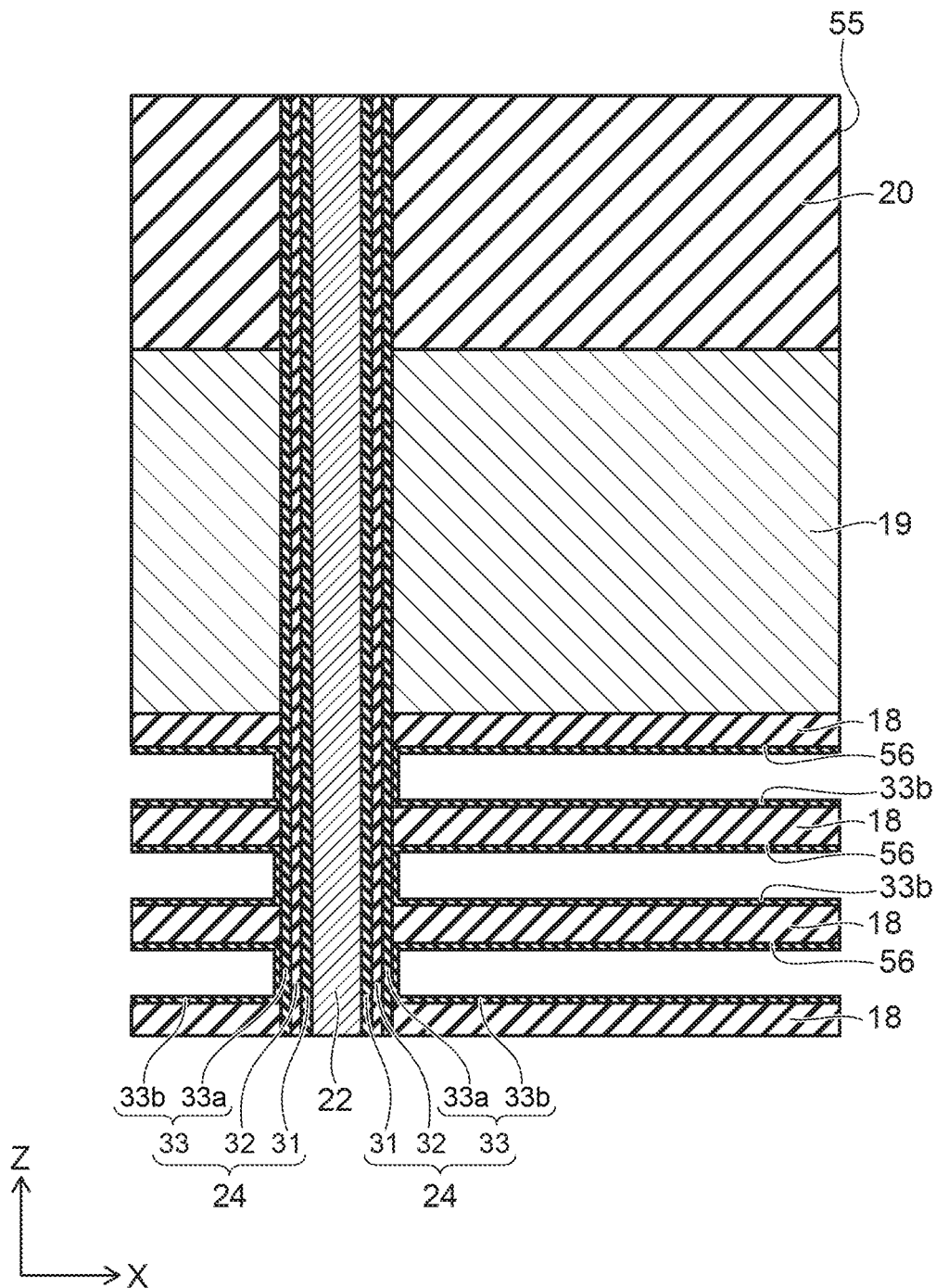

FIG. 16 and FIG. 17 are sectional views showing the method for manufacturing the semiconductor memory device according to the embodiment.

First, the processes shown in FIG. 6 to FIG. 8 are carried out.

Next, as shown in FIG. 16, silicon oxide is deposited on the inner surface of the memory hole 53 to thereby form the silicon oxide layer 33*a*. Next, the charge trap film 32 and the tunnel film 31 are formed in this order on a side surface of the silicon oxide layer 33*a*. Next, the silicon pillar 22 is formed in the memory hole 53 by a method similar to the first embodiment.

Next, the processes shown in FIG. 10 and FIG. 11 are carried out.

Next, as shown in FIG. 17, aluminum oxide is deposited in the space 56 to form the aluminum oxide layer 33*b* on an inner surface of the space 56 and on an inner surface of the trench 55. At an innermost surface of the space 56, the aluminum oxide layer 33*b* is in contact with the silicon oxide layer 33*a*.

Next, as shown in FIG. 15, metal nitride, for example, titanium nitride, tantalum nitride, or tungsten nitride is deposited on a surface of the aluminum oxide layer 33*b* by, for example, a CVD method to form the barrier metal layer 25. Next, tungsten is deposited by, for example, a CVD method to be embedded in the space 56. Next, etching is applied to remove portions of the aluminum oxide layer 33*b*, the barrier metal layer 25, and the tungsten, which are deposited in the trench 55. Due to this, the aluminum oxide layer 33*b*, the barrier metal layer 25, and the electrode film 17 are formed in the space 56.

After this, by a method similar to the first embodiment, the semiconductor memory device 3 according to the embodiment is manufactured.

Next, advantages of the embodiment will be described.

In the embodiment, the aluminum oxide layer 33*b* is not disposed between the electrode film 19 functioning as the upper select gate line and the silicon pillar 22. Due to this, since a gate insulating film of the upper select gate transistor is configured of the tunnel film 31, the charge trap film 32, and the silicon oxide layer 33*a*, the EOT (Equivalent Oxide Thickness) of the gate insulating film is thin compared with the case where the aluminum oxide layer 33*b* is included in the gate insulating film. As a result of this, when the gate length of the upper select gate transistor, that is, the thickness of the electrode film 19 in the Z-direction is constant, cutoff characteristics of the upper select gate transistor can be improved. In other words, it is possible to shorten the gate length of the upper select gate transistor while maintaining the same cutoff characteristics. Due to this, the operating speed of the upper select gate transistor can be improved, and at the same time, miniaturization in the Z-direction in the semiconductor memory device 3 can be achieved.

Configurations, manufacturing methods, and advantages other than those described above in the embodiment are similar to the first embodiment described above.

Fourth Embodiment

Next, a fourth embodiment will be described.

Figure 18:
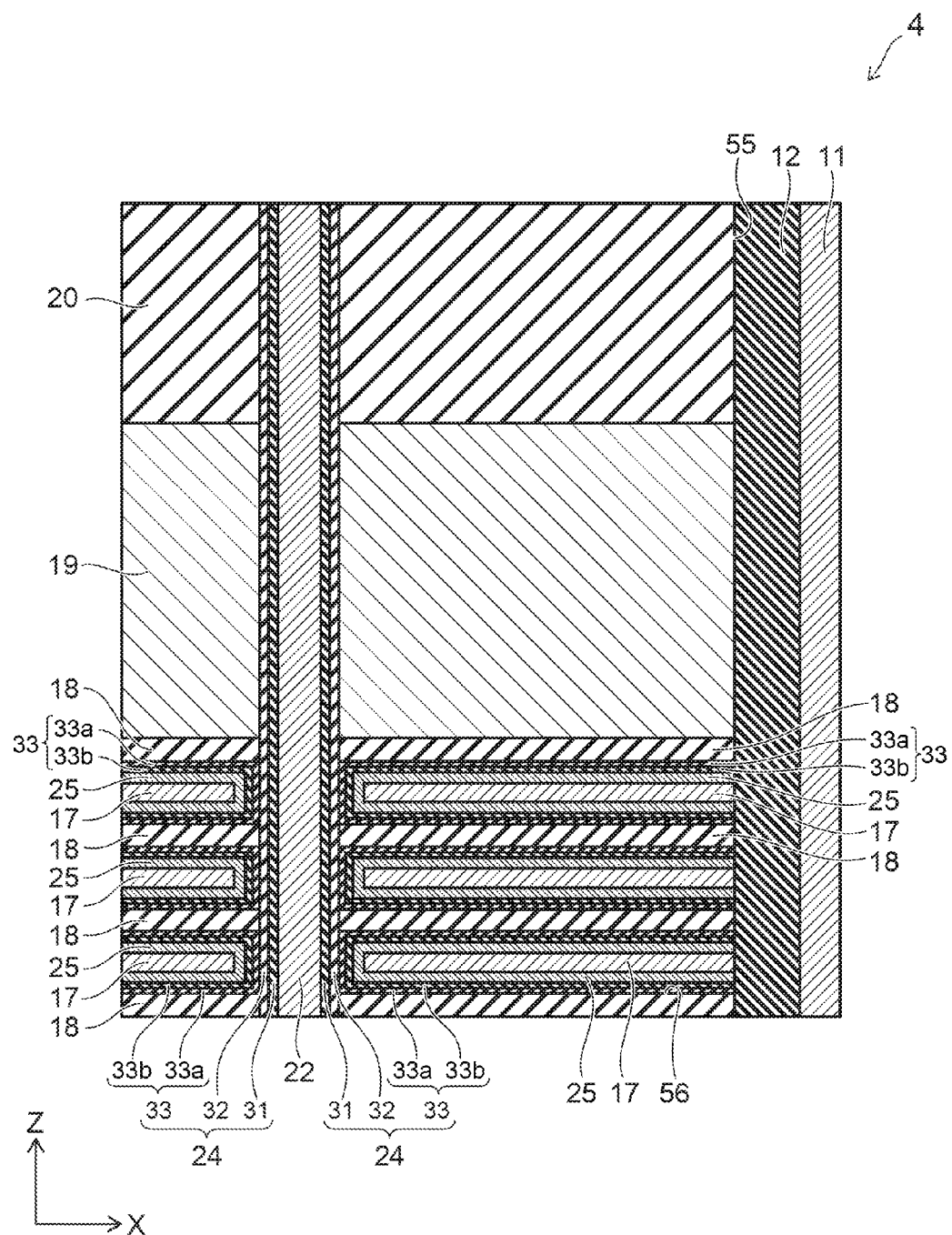
FIG. 18 is a sectional view showing a semiconductor memory device according to a fourth embodiment.

FIG. 18 is a sectional view showing a semiconductor memory device according to the embodiment.

As shown in FIG. 18, in the semiconductor memory device 4 according to the embodiment, the block film 33 is provided on an outer surface of the barrier metal layer 25. That is, the block film 33 is disposed between the barrier metal layer 25 and the silicon oxide film 18 and between the barrier metal layer 25 and the charge trap film 32. On the other hand, the block film 33 is not disposed between the electrode film 17 and the silicon oxide plate 12 and between the silicon oxide film 18 and the silicon oxide plate 12. Moreover, the block film 33 is not disposed between the electrode film 19 and the silicon oxide films 18 and 20 and between the electrode film 19 and the charge trap film 32. For example, the block film 33 is a two-layer film including the aluminum oxide layer 33*b* provided on the outer surface of the barrier metal layer 25, and the silicon oxide layer 33*a* provided on an outer surface of the aluminum oxide layer 33*b*. Instead of the aluminum oxide layer 33*b*, a high dielectric constant layer made of another insulating material having a dielectric constant higher than silicon oxide may be provided.

The tunnel film 31, the charge trap film 32, the silicon oxide layer 33*a*, the aluminum oxide layer 33*b*, and the barrier metal layer 25 are arranged in this order from the silicon pillar 22 toward the electrode film 17 between the silicon pillar 22 and the electrode film 17. On the other hand, the tunnel film 31 and the charge trap film 32 are arranged in this order from the silicon pillar 22 toward the electrode film 19 between the silicon pillar 22 and the electrode film 19. The electrode film 19 is in contact with the charge trap film 32.

Next, a method for manufacturing the semiconductor memory device according to the embodiment will be described.

Figure 19:
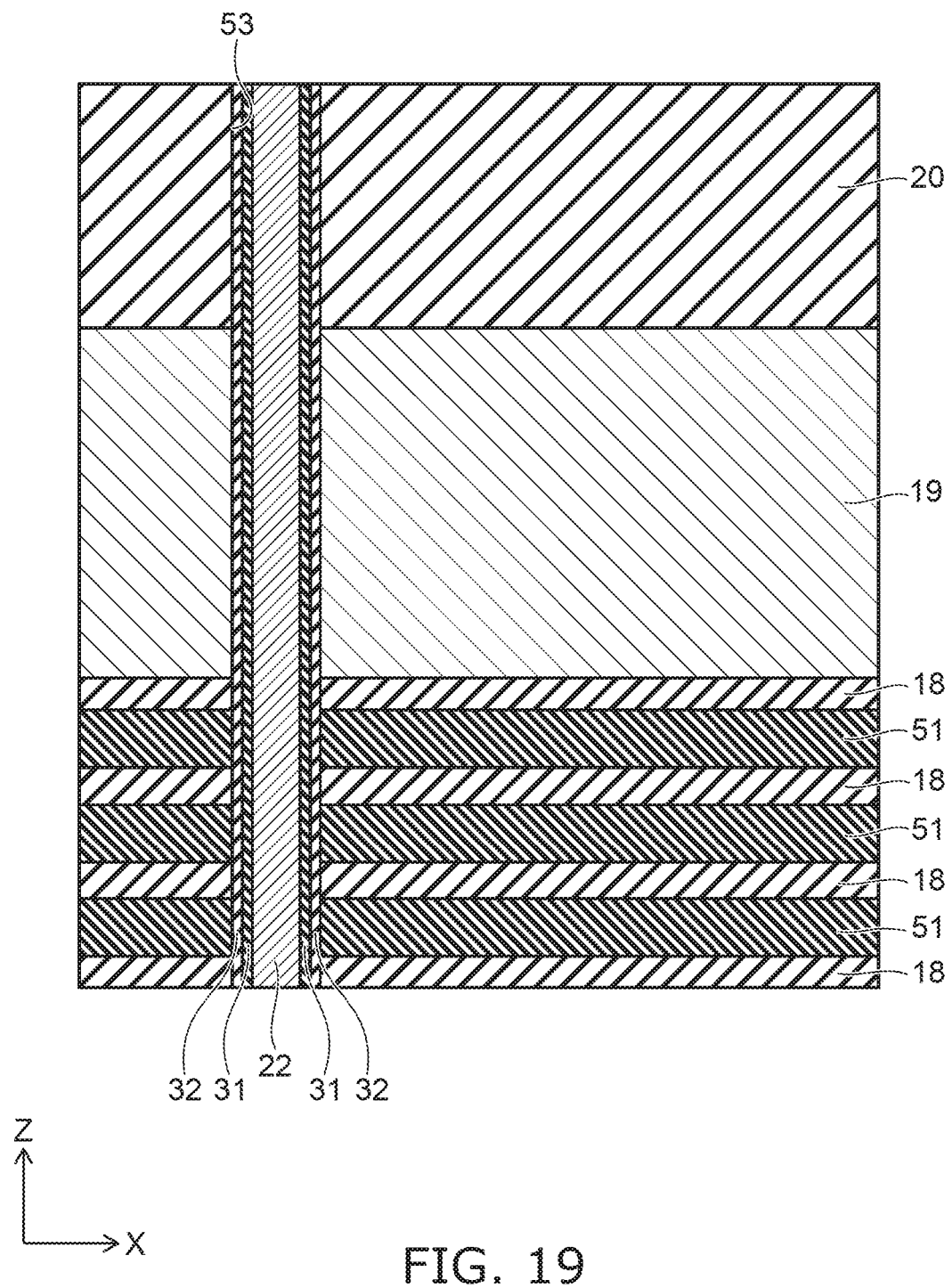
FIG. 19 is a sectional view showing the method for manufacturing the semiconductor memory device according to the fourth embodiment.

FIG. 19 is a sectional view showing the method for manufacturing the semiconductor memory device according to the embodiment.

First, the processes shown in FIG. 6 to FIG. 8 are carried out.

Next, as shown in FIG. 19, the charge trap film 32 and the tunnel film 31 are formed in this order on an inner surface of the memory hole 53. Next, the silicon pillar 22 is formed in the memory hole 53 by a method similar to the first embodiment.

Next, the processes shown in FIG. 10 and FIG. 11 are carried out.

Next, as shown in FIG. 18, silicon oxide is deposited in the space 56 to form the silicon oxide layer 33*a* on an inner surface of the space 56 and on an inner surface of the trench 55. Next, aluminum oxide is deposited to form the aluminum oxide layer 33*b* on a surface of the silicon oxide layer 33*a*. The block film 33 is formed of the silicon oxide layer 33*a* and the aluminum oxide layer 33*b*. Moreover, the memory film 24 is formed of the tunnel film 31, the charge trap film 32, and the block film 33.

Next, metal nitride is deposited on a surface of the aluminum oxide layer 33*b* to form the barrier metal layer 25. Next, tungsten is deposited to be embedded in the space 56. Next, etching is applied to remove portions of the silicon oxide layer 33*a*, the aluminum oxide layer 33*b*, the barrier metal layer 25, and the tungsten, which are deposited in the trench 55. Due to this, the block film 33, the barrier metal layer 25, and the electrode film 17 are formed in the space 56.

After this, by a method similar to the first embodiment, the semiconductor memory device 4 according to the embodiment is manufactured.

Next, advantages of the embodiment will be described.

In the embodiment, the advantages of the third embodiment described above can be further enhanced. That is, since the block film 33 is not disposed between the electrode film 19 functioning as the upper select gate line and the silicon pillar 22, the EOT of the gate insulating film of the upper select gate transistor is thinner. For this reason, when the gate length of the upper select gate transistor is constant, cutoff characteristics of the upper select gate transistor can be further improved. Alternatively, it is possible to further shorten the gate length of the upper select gate transistor while maintaining the same cutoff characteristics.

Configurations, manufacturing methods, and advantages other than those described above in the embodiment are similar to the third embodiment described above.

Fifth Embodiment

Next, a fifth embodiment will be described.

Figure 20:
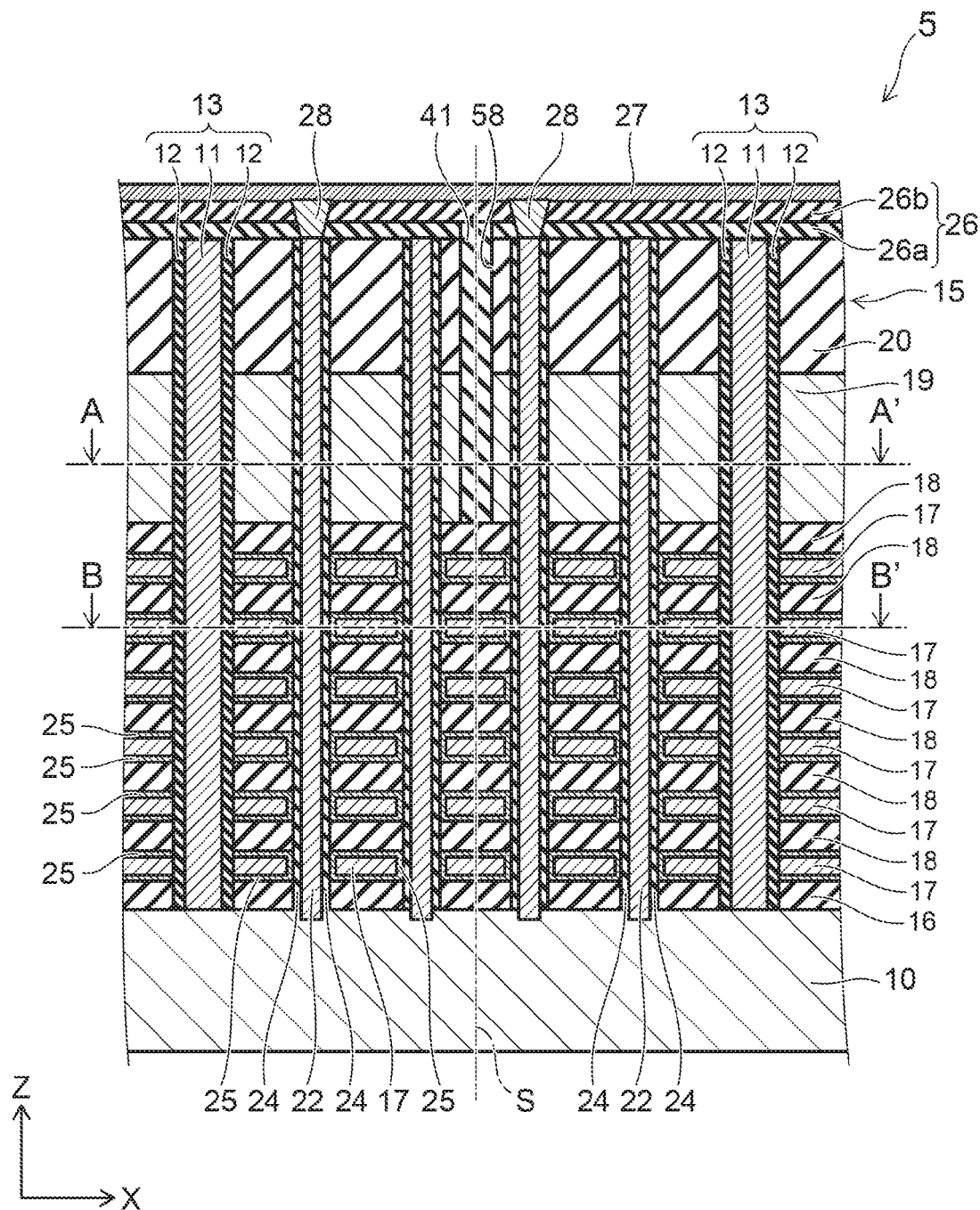
FIG. 20 to FIG. 22 are sectional views showing a semiconductor memory device according to a fifth embodiment.
Figure 21:
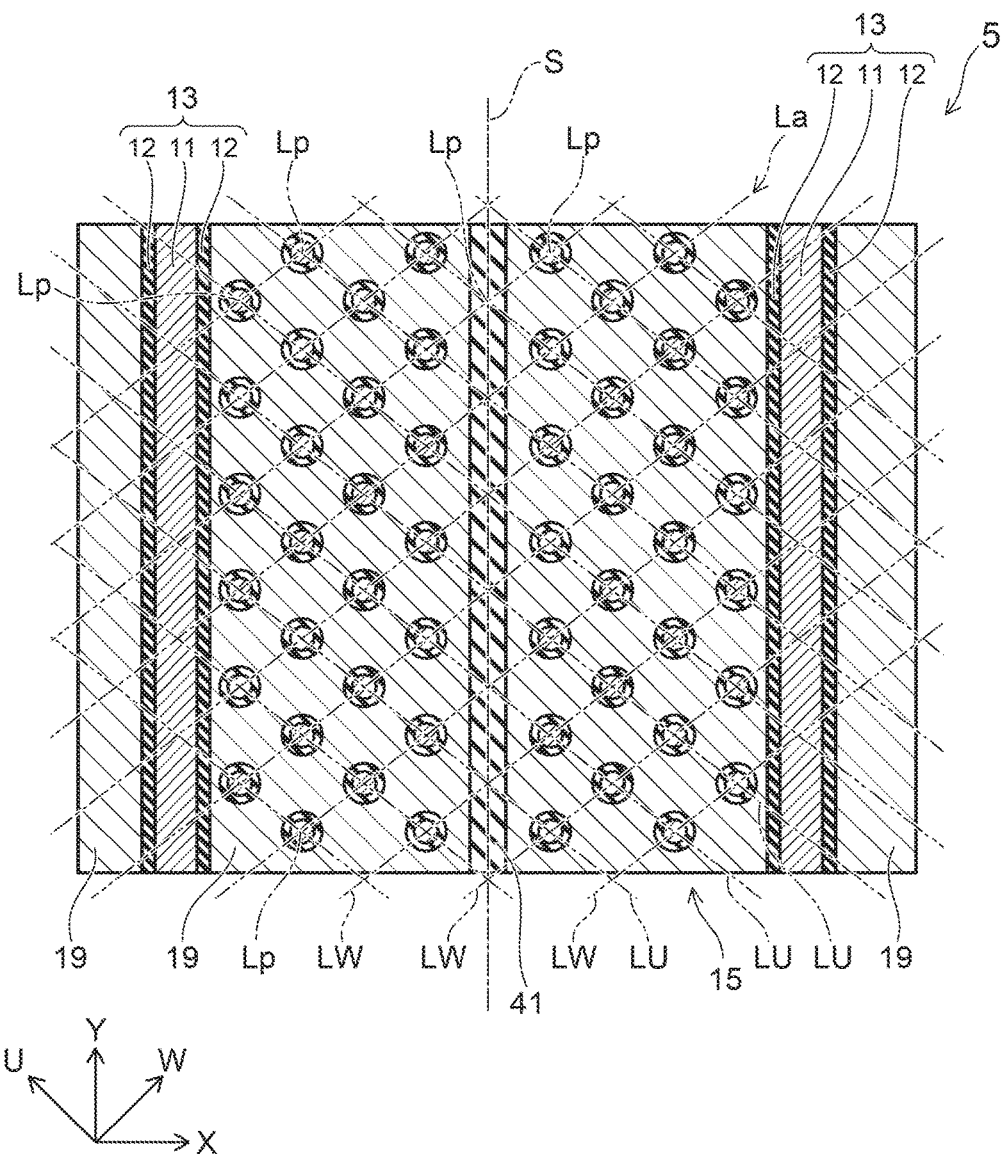
Figure 22:
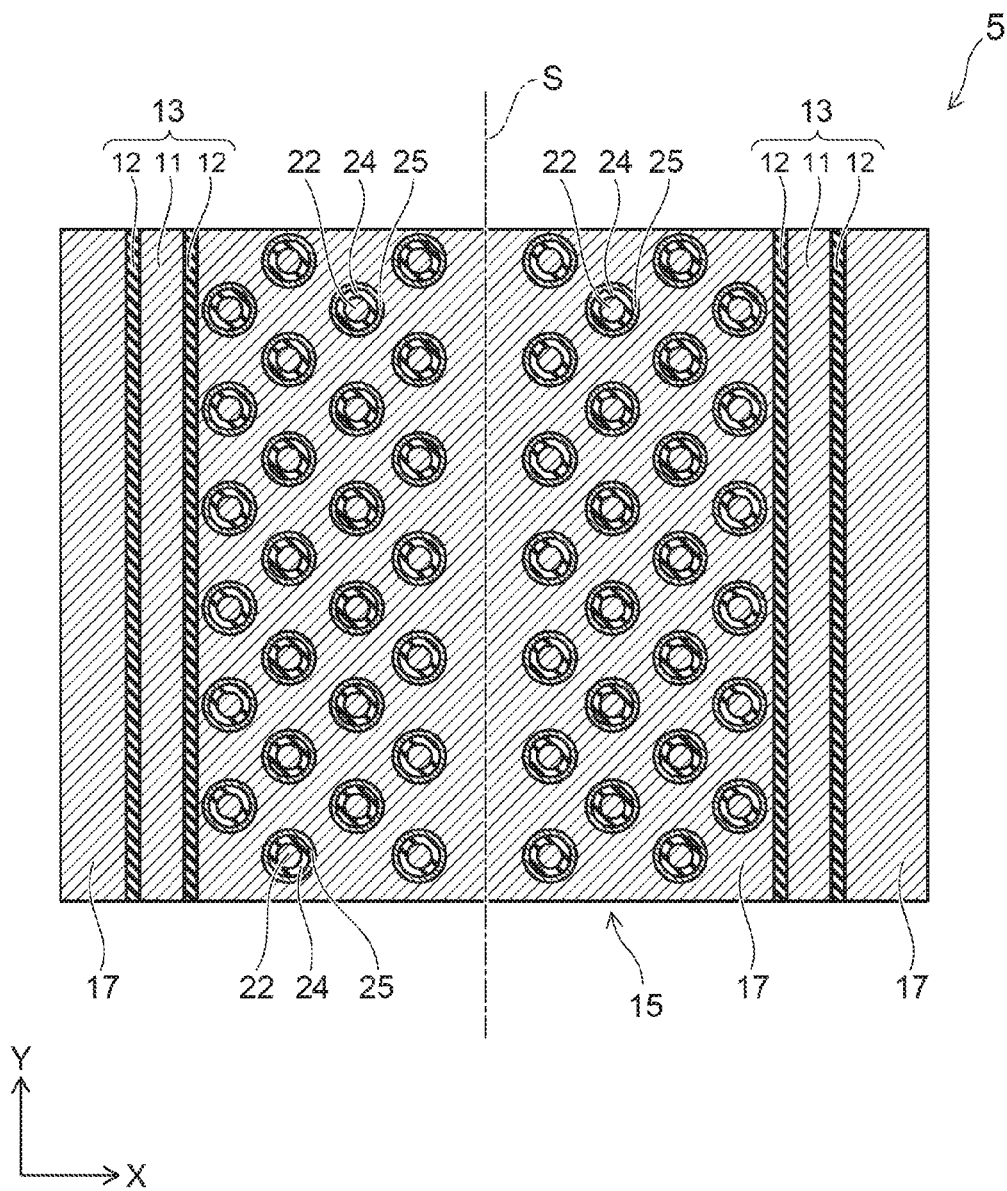

FIG. 20 to FIG. 22 are sectional views showing a semiconductor memory device according to the embodiment.

FIG. 21 is a sectional view along the line A-A' shown in FIG. 20; and FIG. 22 is a sectional view along the line B-B' shown in FIG. 20.

As shown in FIG. 20 to FIG. 22, in the semiconductor memory device 5 according to the embodiment, the silicon oxide film 26 is a two-layer film including a silicon oxide layer 26a at a lower layer and a silicon oxide layer 26b at an upper layer stacked on each other. Moreover, the source electrode structures 13 are each provided between only some of fingers; and the source electrode structure 13 is not provided between the remaining fingers but an insulating member 41 is provided therebetween. Specifically, the source electrode structures 13 and the insulating member 41 are alternately arranged in the X-direction. The insulating member 41 is formed of, for example, silicon oxide, extends in the Y-direction, and is disposed at a position substantially equally distant from two source electrode structures 13 adjacent to each other. The insulating member 41 pierces the electrode film 19, the silicon oxide film 20, and the silicon oxide layer 26a in the Z-direction.

Due to this, in the stacked body 15 interposed between the two source electrode structures 13 adjacent to each other, the electrode film 19 is divided into two portions by the insulating member 41. The divided portions of the electrode film 19 extend in the Y-direction. On the other hand, since the insulating member 41 does not reach the electrode film 17, the electrode films 17 are not divided by the insulating member 41. As a result of this, two fingers that share the electrode films 17 are provided in each of the stacked bodies 15. As described above, the finger includes one electrode film 19 and the portions disposed in the areas directly on and directly below the electrode film 19 in the stacked body 15.

As shown in FIG. 21, in each of the fingers, the silicon pillars 22 are arranged in a four-row stagger as viewed from the Z-direction. In the two fingers interposing the insulating member 41 therebetween, the silicon pillars 22 are arranged plane symmetrically with respect to a Y-Z plane (hereinafter referred to as a "central plane S") including the central axis of the insulating member 41. As a result of this, in each of the stacked bodies 15, the silicon pillars 22 are arranged in eight rows along the Y-direction. The central plane S lies at a substantially equal distance from the two source electrode structures 13 adjacent to each other.

As viewed from the Z-direction, the centers of the plurality of the silicon pillars 22 are disposed at lattice points Lp of a lattice La. The lattice La is configured of a plurality of imaginary straight lines LU extending in a U-direction and arranged at substantially equal intervals, and a plurality of imaginary straight lines LW extending in a W-direction and arranged at substantially equal intervals. The U-direction is inclined with respect to the X-direction and the Y-direction; also, the W-direction is inclined with respect to the X-direction and the Y-direction; and the U-direction and the W-direction cross each other. An angle made by the U-direction and the W-direction may be arbitrary, and may be 90 degrees or may not be 90 degrees. However, in the lattice points Lp, at the lattice points Lp positioned in the insulating member 41, the silicon pillar 22 is not disposed. For this reason, the lattice points Lp at which the silicon pillars 22 are not disposed are arranged in one row along the Y-direction. Along each of the straight lines LU, four silicon pillars 22 are periodically arranged on each of both sides of one lattice point Lp at which the silicon pillar 22 is not disposed. Also for each of the straight lines LW, the silicon pillars 22 are similarly arranged.

As shown in FIG. 20, the plug 28 connected to one bit line 27 is provided for each of the fingers. Due to this, each of the bit lines 27 is connected, via the plug 28, to one silicon pillar 22 provided in each of the fingers. Accordingly, each of the bit lines 27 is connected to two silicon pillars 22 provided in one stacked body 15.

Next, a method for manufacturing the semiconductor memory device according to the embodiment will be described.

First, as shown in FIG. 6, the silicon oxide film 16 is formed on the silicon substrate 10; next, the silicon nitride films 51 and the silicon oxide films 18 are alternately formed; the electrode film 19 is formed by a sputtering method; and the silicon oxide film 20 is formed. Due to this, the stacked body 15a is formed. Next, as shown in FIG. 4, after an edge portion of the stacked body 15a in the Y-direction is processed into a stepped shape, the silicon oxide film 35 is formed.

Next, the mask film 52 is formed on the stacked body 15a. The mask film 52 is, for example, a resist film. Then, the mask film 52 is exposed by a lithography method using a multipole light source. At this time, for example, by disposing openings of an exposure mask (not shown) substantially periodically, a light beam transmitted through the exposure mask and a diffracted light beam interfere so that the intensity of light takes a local maximum value in areas, corresponding to the openings of the exposure mask, in the mask film 52, and thus high-resolution exposure becomes possible. Specifically, as shown in FIG. 21, the openings of the exposure mask are aligned with the lattice points Lp of the lattice La provided with the plurality of imaginary straight lines LU extending in the U-direction and arranged at substantially equal intervals and the plurality of imaginary straight lines LW extending in the W-direction and arranged at substantially equal intervals. However, the openings of the exposure mask are not disposed at the lattice points Lp disposed in the area where the insulating member 41 (see FIG. 20) is to be formed. Next, the mask film 52 is developed. Due to this, the opening 52a is formed in an area, centered on the lattice point Lp, in the mask film 52.

Next, by carrying out the processes shown in FIG. 7 to FIG. 9, the memory holes 53 are formed in the stacked body 15a, and the block film 33, the charge trap film 32, and the tunnel film 31 are formed in this order on an inner surface of the memory hole 53, to thereby form the memory film 24. Next, the silicon pillar 22 is formed in the memory hole 53.

Next, by carrying out the processes shown in FIG. 10 to FIG. 13, the trenches 55 are formed, the silicon nitride films 51 are removed to form the spaces 56, and the barrier metal layer 25 and the electrode film 17 are formed in the space 56. The electrode film 17 is formed by depositing tungsten by a CVD method using tungsten hexafluoride ($WF_6$) as a source gas and using diborane ($B_2H_6$) as a reducing gas. Next, the silicon oxide plate 12 and the source electrode plate 11 are formed in the trench 55 to form the source electrode structure 13.

Next, as shown in FIG. 20, the silicon oxide layer 26a is formed on the stacked body 15. Next, a trench 58 extending in the Y-direction and piercing the silicon oxide layer 26a, the silicon oxide film 20, and the electrode film 19 is formed by, for example, a lithography method and a RIE method. Next, silicon oxide is deposited on the entire surface to planarize the upper surface, so that the insulating member 41 is embedded in the trench 58, and at the same time, the silicon oxide layer 26b is formed on the silicon oxide layer 26a. Next, the plug 28 piercing the silicon oxide layers 26b and 26a is formed. Next, the bit line 27 extending in the X-direction is formed on the silicon oxide film 26, and connected to the plug 28. In this manner, the semiconductor memory device 5 according to the embodiment is manufactured.

Next, advantages of the embodiment will be described.

In the semiconductor memory device 5 according to the embodiment, compared with the semiconductor memory device 1 according to the first embodiment, some of the source electrode structures 13 are each replaced by the insulating member 41. Due to this, since the number of the source electrode structures 13 can be reduced, miniaturization in the X-direction can be achieved.

Moreover, in the embodiment, since the electrode film 19 serving as the upper select gate line is divided by the insulating member 41, the arrangement of the silicon pillars 22 in each of the fingers is a four-row stagger. For this reason, as shown in FIG. 1, it is sufficient that two bit lines 27 pass through an area directly above one silicon pillar 22, and miniaturization in the Y-direction is easy.

It is also considered that every other source electrode structure 13 is simply omitted and the silicon pillars 22 are arranged in an eight-row stagger in each of fingers. In this case, however, four bit lines 27 pass through an area directly above one silicon pillar 22 for connecting one bit line 27 to one silicon pillar 22. As a result of this, the miniaturization of the semiconductor memory device in the Y-direction is hindered.

In addition, in the embodiment, since the etching gas containing fluorine and bromine is used to etch the electrode film 19 in forming the memory hole 53, it is possible to inhibit the memory hole 53 from being formed into a bowing shape. Due to this, even when the miniaturization in the X-direction and the Y-direction is achieved, a distance between the memory holes 53 can be a predetermined value or more, and the sectional area of the electrode film 19 can be a predetermined value or more. As a result of this, even when the electrode film 19 is divided into two portions by the insulating member 41, it is possible to suppress an increase in the resistance of the electrode film 19.

Moreover, in the embodiment, since the barrier metal layer 25 is not provided around the electrode film 19, the electrode film 19 can be formed only of the original electrode material thereof, for example, tungsten to be thick by an amount corresponding to the barrier metal layer 25. Also due to this, it is possible to suppress an increase in the resistance of the electrode film 19.

Further, in the embodiment, since the electrode film 19 is formed by a sputtering method, an impurity concentration is low. Also due to this, the resistance of the electrode film 19 can be reduced. In this manner, by reducing the resistance of the electrode film 19, especially the signal delay of the upper select gate line whose line width in the X-direction is reduced, through division by the insulating member 41, to be less than half compared with the word line and the lower select gate line is inhibited, and the operating speed of the semiconductor memory device 5 can be improved.

Configurations, manufacturing methods, and advantages other than those described above in the embodiment are similar to the first embodiment described above.

Although, in the embodiments described above, an example in which the electrode film 19 is formed of tungsten has been shown, the electrode film 19 is not limited to this and may be formed of, for example, molybdenum (Mo) or may be formed of other metal materials. In general, a high melting point metal used for an interconnect material such as tungsten and molybdenum is little etched by a gas having a $\{C/(C+F)\}$ ratio of 25% or more in etching gases containing carbon and fluorine, but is etched by an etching gas containing fluorine or chlorine and bromine. At this time, when bromine is contained in the etching gas, a reaction product produced by reaction of the high melting point metal with the bromine in the etching gas has a low vapor pressure, and thus adheres to the inner surface of the memory hole 53 to easily form a protective film. Moreover, since the protective film containing the high melting point metal is little etched by the gas having a $\{C/(C+F)\}$ ratio of 25% or more in the etching gases containing carbon and fluorine, the protective film shows high protective characteristics in etching the silicon nitride film 51 and the silicon oxide film 18.

Moreover, although, in the embodiments described above, an example in which the silicon pillar 22 and the source electrode plate 11 are connected to the silicon substrate 10 has been shown, the embodiments are not limited to this. For example, a conductive film may be provided on a base body with an insulating film therebetween, and the silicon pillar 22 and the source electrode plate 11 may be connected to this conductive film. In this case, a structure composed of the base body, the insulating film, and the conductive film functions as a substrate in which the upper layer portion thereof is conductive.

Further, in the embodiments described above, after the electrode films 17 are formed in the spaces 56, at least portions of the silicon oxide films 16 and 18 may be removed by, for example, wet etching to form an air gap between the silicon substrate 10 and the electrode film 17, between the electrode films 17, and between the electrode film 17 and the electrode film 19.

Furthermore, although, in the first, second, and fifth embodiments described above, an example in which titanium nitride or the like is deposited on the entire inner surface of the space 56 to form the barrier metal layer 25 in the process shown in FIG. 12 has been shown, the embodiments are not limited to this. For example, when titanium nitride serving as the material of the barrier metal layer 25 is deposited, the barrier metal layer 25 may be formed on only either the upper and lower surfaces of the space 56 or the innermost surface thereof utilizing a difference in incubation time due to a difference in foundation material. Specifically, the silicon oxide film 18 is exposed in the upper surface and the lower surface of the space 56, and the outermost peripheral portion of the memory film 24, that is, the block film 33, is exposed in the innermost surface of the space 56. An outer peripheral surface of the block film 33 is configured of, for example, aluminum oxide. For this reason, after titanium nitride is deposited, short-time wet processing is performed to remove the titanium nitride from the upper and lower surfaces of the space 56 or the innermost surface thereof, whichever has a slower deposition rate of titanium nitride. Due to this, the barrier metal layer 25 remains on only either the upper and lower surfaces of the space 56 or the innermost surface thereof. In this manner, even when the barrier metal layer 25 is removed from either the upper and lower surfaces of the space 56 or the innermost surface thereof, the electrode film 17 can be embedded in the space 56 by depositing tungsten from the surface on which the barrier metal layer 25 remains.

Furthermore, the embodiments described above can be carried out in combination with each other. For example, when a portion or all of the block film 33 is formed from a side of the space 56 as in the third and fourth embodiments described above, the upper select gate line may be configured of a plurality of electrode films 29 as in the second embodiment described above, or the upper select gate line may be divided by the insulating member 41 as in the fifth embodiment described above. Moreover, when the upper select gate line is divided by the insulating member 41 as in the fifth embodiment described above, the upper select gate line may be configured of a plurality of electrode films 29 as in the second embodiment described above.

Comparative Example

Next, a comparative example will be described.

Figure 23:
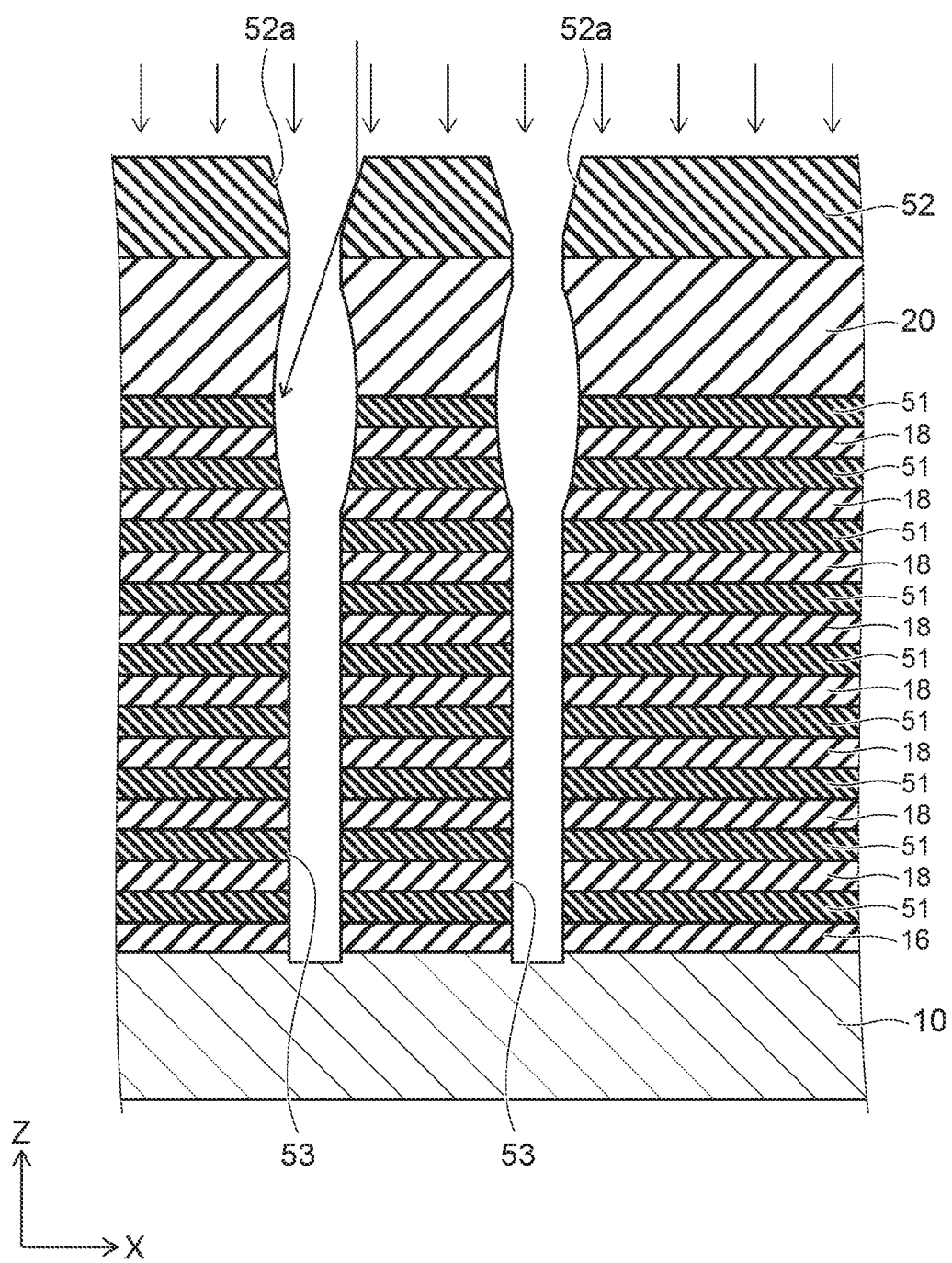
FIG. 23 is a sectional view showing a method for manufacturing a semiconductor memory device according to a comparative example.

FIG. 23 is a sectional view showing a method for manufacturing a semiconductor memory device according to the comparative example.

As shown in FIG. 23, in the comparative example, the silicon nitride films 51 and the silicon oxide films 18 are alternately stacked on the silicon oxide film 16, and the silicon oxide film 20 is formed on the silicon nitride films 51 and the silicon oxide films 18 stacked on each other. At this time, an electrode film made of tungsten is not formed.

Next, the mask film 52 is formed on the silicon oxide film 20, and the memory hole 53 is formed by applying RIE using the mask film 52 as a mask. At this time, an etching gas containing carbon and fluorine is used. In the comparative example, since tungsten and bromine are not supplied in the memory hole 53 during the etching, the protective film 54 (see FIG. 7) is not formed. For this reason, ions recoil on a tapered-shaped inner side surface of the opening 52a of the mask film 52, and the ions reach an area, on a side opposite to a recoil surface, in the inner surface of the memory hole 53 and thus side-etch this area. Due to this, a diameter is increased in an upper portion of the memory hole 53, so that the memory hole 53 is formed into a bowing shape shown in FIG. 23.

In subsequent processes, the memory film 24 and the silicon pillar 22 are formed in the memory hole 53; the trenches 55 (see FIG. 10) are formed in the stacked body; the silicon nitride films 51 are removed through the trenches 55 to form the spaces 56 (see FIG. 11); the barrier metal layer 25 (see FIG. 12) is formed on an inner surface of the space 56; and the electrode film 17 (see FIG. 2) made of tungsten is embedded. Then, the electrode film 17 at an upper stage is used as the upper select gate line; the electrode films 17 at middle stages are used as the word lines; and the electrode film 17 at a lower stage is used as the lower select gate line.

In the comparative example, since the upper portion of the memory hole 53 is formed into a bowing shape, the horizontal sectional area of the electrode film 17 at this portion is reduced, and the resistance of the electrode film 17 rises. Moreover, at this portion, the inside diameter of the electrode film 17 surrounding the silicon pillar 22 becomes large. As a result of this, an electric field applied from the electrode film 17 to the silicon pillar 22 is weakened, and the control of the electrode film 17 over the silicon pillar 22 is weakened. In general, a portion where a bowing shape is likely to be generated is a portion corresponding to the upper select gate transistor, and the electrode film 17 functions as the upper select gate line. In this case, switching characteristics of the upper select gate transistor are degraded. Moreover, when the electrode film 17 at the portion where the bowing shape is generated is the word line, operating characteristics of the memory cell transistor are degraded. Further, when the memory hole 53 is formed into an extreme bowing shape, the memory holes 53 adjacent to each other are in communication with each other and thus fail to function as NAND strings.

In contrast to this, according to the embodiments described above, after the electrode film 19 or 29 made of tungsten is formed in the upper portion of the stacked body 15a, the electrode film 19 or 29 is etched by the etching gas containing bromine; and therefore, the protective film 54 can be formed on the side surface of the upper portion of the memory hole 53, and it is possible to inhibit the bowing shape from appearing.

According to the embodiments explained above, a semiconductor memory device and a method for manufacturing the semiconductor memory device having stability in characteristics can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor memory device comprising:
    a plurality of lower electrode films stacked separated from each other;
    an upper electrode film provided above the plurality of lower electrode films;
    a semiconductor pillar extending in an arrangement direction of the plurality of lower electrode films and the upper electrode film;
    a memory film provided between the semiconductor pillar and one of the plurality of lower electrode films and between the semiconductor pillar and the upper electrode film; and
    a metal-containing layer provided at at least one of on a lower surface and an upper surface of the one of the plurality of lower electrode films and between the one of the plurality of lower electrode films and the memory film, the metal-containing layer having a composition different from a composition of the plurality of lower electrode films, the upper electrode film being in contact with the memory film, and the one of the plurality of lower electrode films not being in contact with the memory film.

2. The device according to claim 1, wherein the upper electrode film is thicker than the one of the plurality of lower electrode films in the arrangement direction.

3. The device according to claim 1, wherein a plurality of the upper electrode films are provided, and the plurality of upper electrode films are arranged separated from each other along the arrangement direction.

4. The device according to claim 1, wherein the metal-containing layer contains one or more kinds of metals selected from the group consisting of titanium, tantalum, and tungsten, and the metal-containing layer contains nitrogen.

5. The device according to claim 1, wherein the metal-containing layer is not provided on a lower surface and an upper surface of the upper electrode film.

6. The device according to claim 1, wherein the upper electrode film and the plurality of lower electrode films include tungsten or molybdenum.

7. The device according to claim 1, further comprising:
a substrate provided below the plurality of lower electrode films;
a plurality of electrode members provided on both sides of a stacked body including the plurality of lower electrode films and the upper electrode film stacked with each other, the plurality of electrode members being connected to the substrate; and
insulating plates each disposed between the stacked body and each of the electrode members, and in contact with the plurality of lower electrode films and the upper electrode film.

8. The device according to claim 7, further comprising another stacked body provided above the substrate, wherein
the electrode members extend in a first direction crossing the arrangement direction,
one of the electrode members is disposed between the stacked body and the another stacked body,
the another stacked body includes
a plurality of other lower electrode films stacked separated from each other along the arrangement direction, and
another upper electrode film provided above the plurality of other lower electrode films,
each of the lower electrode films and each of the other lower electrode films are electrically connected to each other, and
the upper electrode film and the another upper electrode film are insulated from each other.

9. The device according to claim 7, further comprising an insulating member provided above the plurality of lower electrode films, extending between the plurality of electrode members in a same direction as the plurality of electrode members, and dividing the upper electrode film.

10. A semiconductor memory device comprising:
a plurality of lower electrode films stacked separated from each other;
an upper electrode film provided above the plurality of lower electrode film;
a semiconductor pillar extending in an arrangement direction of the plurality of lower electrode films and the upper electrode film;
a first insulating film provided between the semiconductor pillar and one of the plurality of lower electrode films and between the semiconductor pillar and the upper electrode film, the first insulating film including a charge trap film; and
a second insulating film provided on a side of a lower surface of the one of the plurality of lower electrode films, on a side of an upper surface of the one of the plurality of lower electrode films, and between the one of the plurality of lower electrode films and the first insulating film, the second insulating film having a composition different from a composition of the first insulating film,
the upper electrode film being in contact with the first insulating film, and the one of the plurality of lower electrode films not being in contact with the first insulating film.

11. The device according to claim 10, wherein the first insulating film further includes:
a tunnel film provided between the semiconductor pillar and the charge trap film and containing silicon and oxygen; and
a first insulating layer provided between the charge trap film and the one of the plurality of lower electrode films and between the charge trap film and the upper electrode film, and containing silicon and oxygen,
the charge trap film contains silicon and nitrogen, and
a dielectric constant of the second insulating film is higher than a dielectric constant of the first insulating layer.

12. The device according to claim 10, wherein the first insulating film further includes:
a tunnel film provided between the semiconductor pillar and the charge trap film and containing silicon and oxygen,
the charge trap film contains silicon and nitrogen,
the second insulating film includes:
a first insulating layer in contact with the charge trap film and containing silicon and oxygen; and
a second insulating layer provided between the first insulating layer and the one of the plurality of lower electrode films, and
a dielectric constant of the second insulating layer is higher than a dielectric constant of the first insulating layer.

13. The device according to claim 10, further comprising a metal-containing layer provided on the lower surface of the one of the plurality of lower electrode films, on the upper surface of the one of the plurality of lower electrode films, and between the one of the plurality of lower electrode films and the second insulating film, the metal-containing layer having a composition different from a composition of the plurality of lower electrode films.

* * * * *